(12) United States Patent
Fukuda et al.

(10) Patent No.: US 10,553,811 B2
(45) Date of Patent: Feb. 4, 2020

(54) ORGANIC EL DISPLAY PANEL MANUFACTURING METHOD AND INK DRYING DEVICE

(71) Applicant: JOLED INC., Tokyo (JP)

(72) Inventors: Toshio Fukuda, Tokyo (JP); Yoshiaki Kondo, Tokyo (JP); Yoichi Shintani, Tokyo (JP); Noriteru Maeda, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/799,478

(22) Filed: Oct. 31, 2017

(65) Prior Publication Data

US 2018/0123076 A1 May 3, 2018

(30) Foreign Application Priority Data

Nov. 1, 2016 (JP) .................................. 2016-214595
Jul. 13, 2017 (JP) .................................. 2017-137208

(51) Int. Cl.
*H01L 51/52* (2006.01)
*H01L 27/32* (2006.01)

(52) U.S. Cl.
CPC ...... *H01L 51/5203* (2013.01); *H01L 27/3211* (2013.01); *H01L 27/3246* (2013.01); *H01L 2227/323* (2013.01)

(58) Field of Classification Search
CPC .. H01L 51/5203; H01L 51/0004; H01L 51/56
See application file for complete search history.

(56) References Cited

U.S. PATENT DOCUMENTS

| 5,443,922 A | 8/1995 | Nishizaki et al. |
| 2015/0137087 A1* | 5/2015 | Yamamoto .......... H01L 51/0004 257/40 |
| 2015/0325817 A1* | 11/2015 | Kim .................... H01L 51/0028 438/34 |

FOREIGN PATENT DOCUMENTS

| JP | 5-163488 A | 6/1993 |
| JP | 2002-515585 A | 5/2002 |
| JP | 2007-90200 A | 4/2007 |

(Continued)

OTHER PUBLICATIONS

Kazuhiro, English translation of JP-2007090200-A, dated Apr. 2007.*

*Primary Examiner* — Xia L Cross
(74) *Attorney, Agent, or Firm* — Hauptman Ham, LLP

(57) ABSTRACT

A method of manufacturing an organic electroluminescence display panel includes forming pixel electrode layers in a matrix on a substrate. The method includes arranging column banks extending in a column direction above the substrate. The method includes applying ink containing organic light emitting material to gaps between the column banks so that the ink is continuous between ends of the column banks in the column direction. The method includes arranging the substrate and a rectifying plate facing each other, the rectifying plate having a uniform density of through holes, such that the rectifying plate is at a predefined distance from the column banks. The method includes exhausting gas from an environment including the substrate and the rectifying plate. The method further includes heating the substrate to dry the ink to form an organic functional layer. The method includes forming a counter electrode layer above the organic functional layer.

17 Claims, 28 Drawing Sheets

(56) References Cited

FOREIGN PATENT DOCUMENTS

| | | | |
|---|---|---|---|
| JP | 2010-267428 | A | 11/2010 |
| JP | 2011-25244 | A | 2/2011 |
| JP | 2013-250002 | A | 12/2013 |
| WO | 99/60319 | A1 | 11/1999 |

* cited by examiner

ORGANIC EL DISPLAY PANEL MANUFACTURING METHOD AND INK DRYING DEVICE

This application claims priority to Japanese Patent Application No. 2016-214595, filed Nov. 1, 2016; and Japanese Patent Application No. 2017-137208, filed Jul. 13, 2017, the contents of which are hereby incorporated by reference in their entirety.

BACKGROUND OF THE DISCLOSURE

Technical Field

The present disclosure relates to methods of manufacturing organic electroluminescence (EL) display panels that use organic EL elements that make use of electroluminescence of organic material, and ink drying devices usable in such methods.

Description of the Related Art

Recently, organic EL display panels in which organic EL elements are arranged in a matrix on a substrate are being realized as display panels used in display devices such as digital televisions. In such organic EL display panels, each organic EL element emits light and therefore visibility is high.

In such an organic EL display panel, typically, a light emitting layer of each organic EL element and an adjacent organic EL element are partitioned by an insulating layer made of an insulating material. In a color display organic EL display panel, such organic EL elements form RGB pixels, and adjacent RGB pixels are combined to form unit pixels in a color display. Each organic EL element has an element structure in which a functional film, such as a light emitting layer including an organic light emitting material, is disposed between an anode and a cathode electrode pair. When driven, a voltage is applied between the electrode pair, and as holes are injected to the light emitting layer from the anode and electrons are injected to the light emitting layer from the cathode recombine, light is emitted from the functional film.

Recently, as display devices have increased in size, a wet process has been proposed as a method of forming an efficient functional film, in which ink containing a functional material is applied based on a method such as an inkjet method. A wet process has merit in that positional precision when separately applying functional films does not depend on substrate size, and therefore the technical barrier to increasing display device size is relatively low. In a typical inkjet wet process, a substrate to which ink is to be applied is placed on a work table of an application device. An inkjet head is scanned over a surface of the substrate in one direction, and ink is dropped from nozzles of the inkjet head to a predefined region of the surface of the substrate. Subsequently, solvent of the ink is evaporated and the ink dried to form a functional film.

In a wet process in which a functional layer is formed by applying ink onto a substrate and drying the ink. Drying the ink includes evaporating and drying the solvent. Solvent vapor pressure is lower in a peripheral portion of a film forming area than in a central portion thereof, and therefore an evaporation rate of the solvent is greater in the peripheral portion of the film forming area. As a result, there is a tendency that film thickness of a functional layer of a pixel formed in a central portion of the substrate and film thickness of a functional layer of a pixel formed in an end portion of the substrate are different from each other. Thus, when film thickness of functional layers differs between pixels of the central portion of the substrate and pixels of a peripheral portion of the substrate, properties of the functional layers are different from each other. Differences in properties of the functional layers cause in-plane luminance unevenness in an organic EL display panel.

As a response to this, for example, JP2010-267428 proposes a functional film forming method in which ink is dried while a rectifying plate covers a substrate, the rectifying plate having openings only at both ends thereof in a direction of extension of line banks. According to the method proposed in JP2010-267428, movement of solvent in a minor axis direction of the line banks is reduced, and therefore drying unevenness can be reduced and thickness of functional films can be controlled. Further, JP2007-90200 proposes a drying method of exhausting ink solvent to an upper side of a substrate by using a rectifying plate having a through hole.

SUMMARY

As panel resolution increases, better control over film thickness variations than is possible using the manufacturing methods disclosed in JP2010-267428 and JP2007-90200 will help to further improve evenness of luminance across the display panel.

The present disclosure includes an organic EL display panel manufacturing method and an ink drying device that uses the method, for improving in-plane luminance uniformity by equalizing film thickness of light emitting layers in column application regions on a substrate.

A method of manufacturing an organic EL display panel pertaining to at least one aspect of the present disclosure is a method of manufacturing an organic EL display panel in which pixels are arranged in a matrix of rows and columns on a substrate. The method includes preparing the substrate. The method further includes forming pixel electrode layers in the matrix on the substrate. The method further includes arranging column banks, which extend in a column direction, above the substrate along a row direction and disposed at least between edges of the pixel electrode layers in the row direction. The method further includes applying ink containing organic light emitting material to gaps between adjacent ones of the column banks so that the ink is continuous between ends of the adjacent ones of the column banks in the column direction. The method further includes arranging the substrate with the ink applied and a rectifying plate facing each other, the rectifying plate having a uniform density of through holes, such that the rectifying plate is at a predefined distance from the column banks and the through holes are disposed in at least a range facing the column banks in plan view of the substrate. The method further includes exhausting gas from an environment including the substrate and the rectifying plate. The method further includes drying the ink by heating the substrate, to form an organic functional layer. The method further includes forming a counter electrode layer above the organic functional layer after removing the rectifying plate.

According to the method of manufacturing the organic EL display panel pertaining to at least one aspect of the present disclosure, luminance uniformity across the organic EL display panel can be improved by making film thickness more uniform for light emitting layers within column shaped application regions and between column shaped application regions on a substrate.

BRIEF DESCRIPTION OF DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

DETAILED DESCRIPTION

Figure 1:
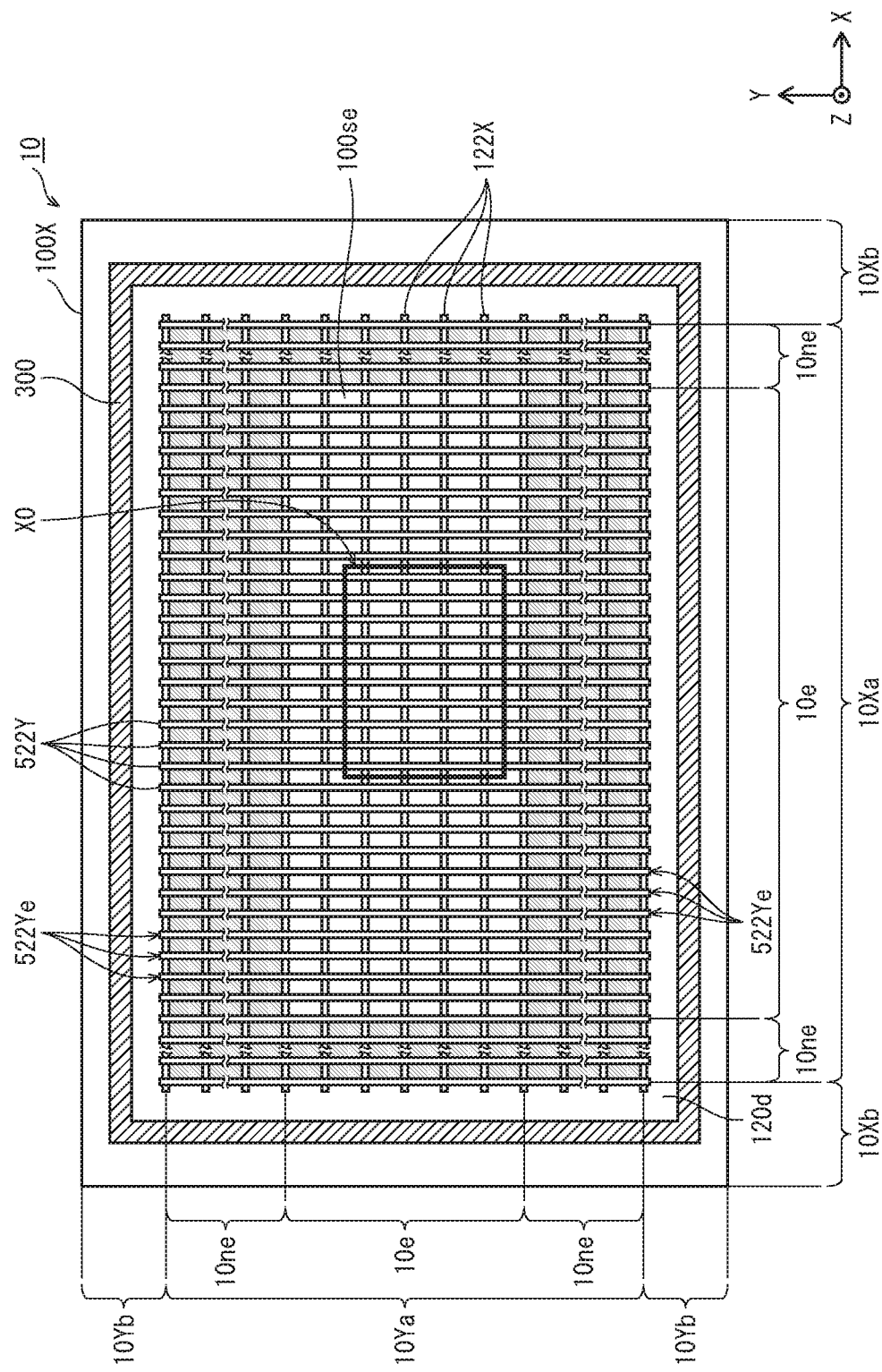
FIG. 1 is a schematic plan view of organic EL display panel 10 manufactured by a manufacturing method pertaining to at least one embodiment.

Recently, along with increases in panel resolution, amounts of ink applied in one pixel region have decreased, which has a large influence on both drying time in an exhaust direction in an ink drying process and pixel region ink shape. Thus, according to the manufacturing method described in JP2010-267428, in which an air current across the substrate is generated, drying of a portion close to outside air becomes faster and drying of the central portion of a panel becomes slower, causing differences in drying time across a substrate plane.

Further, according to the manufacturing method described in JP2007-90200, flow of exhaust across the substrate is cut off by partitioning the plane surface of the substrate by using a partition member provided on the rectifying plate. The intention of the partition member is to cause an effect of exhaust flowing upward. The partition member is disposed by calculating distance from a pixel end to a movable distance of exhaust (mean free path). In a panel having independent pixel banks for each pixel, ink does not flow between pixels, and therefore even when cutting off flow of exhaust across the substrate by partitioning the substrate surface with a partition member, non-uniformity of film thickness of functional layers does not become a technical problem in some instances.

However, in a panel having line banks in which pixels are connected in a column or row direction on a substrate, the structure is already designed to suppress application unevenness by promoting ink flow between pixels, and therefore ink easily flows between pixels in either the column or row direction. Thus, suppressing drying more than necessary by use of the partition member may hinder film thickness uniformity. That is, when pixels are separate, there is no interaction between pixels and levelling the ink by suppressing drying is possible, but in the case of line banks in which ink flows between pixels within the banks, partitioning may conversely cause ink surface height to become nonuniform between pixels.

Accordingly, at least one embodiment of the present disclosure realizes a balance between drying suppression and exhaust in a high resolution panel that includes line banks.

Further, adopting a partitioned configuration in which a partition member partitions line banks that connect pixels along either a column or row direction on the substrate allows ink to flow between sections while cutting off flow of exhaust in a lateral direction. Thus, when a difference occurs in drying speed between sections, nonuniformity of film thickness of between sections is caused by ink flow between sections and this nonuniformity is thought to also influence nonuniformity of film thickness within sections.

In view of the above, the inventors have made extensive studies on a method of achieving a balance between drying suppression and exhaust in a panel configured with line banks, and have arrived at the manufacturing method pertaining to at least one embodiment of the present disclosure.

The method of manufacturing an organic EL display panel pertaining to at least one embodiment is a method of manufacturing an organic EL display panel in which pixels are arranged in a matrix of rows and columns on a substrate. The method includes preparing the substrate. The method further includes forming pixel electrode layers in the matrix on the substrate. The method further includes arranging column banks, which extend in a column direction, above the substrate along a row direction and disposed at least between edges of the pixel electrode layers in the row direction. The method further includes applying ink containing organic light emitting material to gaps between adjacent ones of the column banks so that the ink is continuous between ends of the adjacent ones of the column banks in the column direction. The method further includes arranging the substrate with the ink applied and a rectifying plate facing each other, the rectifying plate having a uniform density of through holes, such that the rectifying plate is at a predefined distance from the column banks and the through holes are disposed in at least a range facing the column banks in plan view of the substrate. The method further includes exhausting gas from an environment including the substrate and the rectifying plate; drying the ink by heating the substrate, to form an organic functional layer. The method further includes forming a counter electrode layer above the organic functional layer after removing the rectifying plate.

According to the method of manufacturing a display panel including the ink drying process, film shape and film thickness of light emitting layers formed become substantially equivalent in both peripheral portions and central portions of a film forming area. That is, suppressing film thickness variation caused by imbalance of solvent evaporation speed due to ink solvent vapor concentration distribution in central and peripheral portions of the substrate, and alleviating the influence of ink convection caused by imbalance of ink surface tension in column shaped application regions when manufacturing by applying ink containing organic light emitting material to the column shaped application regions on the substrate is possible. As a result, film thickness of light emitting layers in the column shaped application regions and between the column shaped application regions on the substrate can be made more uniform, and luminance unevenness caused by nonuniformity of film thickness of the light emitting layers can be reduced across the display panel.

According to at least one embodiment of the method, during the drying of the ink, while the substrate and the rectifying plate are facing each other, a ratio of a minimum gap between the rectifying plate and the column banks and opening length of the through holes is from 0.5 to 2.

With this configuration, in the space between the substrate and the rectifying plate, ink solvent vapor evaporated from the partitioned region on the substrate is suppressed from moving across the substrate, and can be exhausted above the rectifying plate via through holes.

According to at least one embodiment of the method, a ratio of open area of the rectifying plate in a range of the rectifying plate facing the column banks is from 10% to 60%. According to at least one embodiment of the method, a ratio of open area of the rectifying plate in a range of the rectifying plate facing the column banks is from 20% to 40%.

With this configuration, in the space between the substrate and the rectifying plate, ink solvent vapor evaporated from the partitioned region on the substrate is suppressed from moving across the substrate, and can be exhausted above the rectifying plate via through holes.

According to at least one embodiment of the method, the rectifying plate has a peripheral wall surrounding a region on the rectifying plate that faces the column banks, and during the drying of the ink, the peripheral wall surrounds the column banks in plan view of the substrate.

According to this configuration, film thickness variation caused by imbalance in solvent evaporation rate due to vapor concentration distribution of ink solvent between a central portion and a peripheral portion of the substrate in the row and column directions thereof is reduced or substantially eliminated. As a result, further improvement can be made to luminance unevenness caused by nonuniformity of film thickness of the light emitting layers in peripheral and central portions of the film forming area.

An ink drying device pertaining to at least one embodiment is an ink drying device usable for drying ink that is applied to gaps between adjacent ones of column banks disposed on a substrate so that the ink is continuous between ends of the adjacent ones of the column banks in a column direction thereof. The ink drying device includes a chamber in which the substrate with the ink applied is installed. The ink drying device further includes a support base in the chamber on which the substrate is placed. The ink drying device further includes a rectifying plate provided with a uniform density of through holes. The ink drying device further includes a support unit that causes the rectifying plate to face the support base such that the rectifying plate is at a predefined distance from the column banks and the through holes are disposed in at least a range facing the column banks in plan view of the substrate. The ink drying device further includes a unit that exhausts gas from the chamber. The ink drying device further includes a unit that heats the substrate.

According to at least one embodiment of the device, while the support base and the rectifying plate are facing each other, a ratio of a minimum gap between the rectifying plate and the column banks and opening length of the through holes is from 0.5 to 2. According to another example of the device, a ratio of open area of the rectifying plate in a range of the rectifying plate facing the column banks is from 20% to 60%. According to at least one embodiment of the device, a ratio of open area of the rectifying plate in a range of the rectifying plate facing the column banks is from 20% to 40%. According to at least one embodiment of the device, the rectifying plate has a peripheral wall surrounding a region on the rectifying plate that faces the column banks, and while the rectifying plate is facing the support base with the substrate thereon, the peripheral wall surrounds the column banks in plan view of the substrate.

In an ink drying process using the ink drying device, film shape of the light emitting layers to be formed become uniform in both a peripheral portion and a central portion of a film forming area. As a result, luminance uevenness across a display panel caused by nonuniformity of film thickness of the light emitting layers in peripheral and central portions of the film forming area is reduced.

According to at least one embodiment of the device, the ink drying device further comprises a lidding mechanism capable of opening and closing all or part of the through holes provided in the rectifying plate.

According to this configuration, for a predefined time while all or part of the through holes are closed, maintaining a high vapor concentration of ink solvent vapor in the environment between the rectifying plate and the substrate and suppressing ink solvent evaporation from the partitioned region of the substrate is possible.

Further, an ink drying process used by the ink drying device may be a method of manufacturing an organic EL display panel in which pixels are arranged in a matrix of rows and columns on a substrate. The method includes preparing the substrate. The method further includes forming pixel electrode layers in the matrix on the substrate. The method further includes arranging column banks, which extend in a column direction, above the substrate along a row direction and disposed at least between edges of the pixel electrode layers in the row direction. The method further includes applying ink containing organic light emitting material to gaps between adjacent ones of the column banks so that the ink is continuous between ends of the adjacent ones of the column banks in the column direction. The method further includes arranging the substrate with the ink applied and a rectifying plate facing each other, the rectifying plate having a uniform density of through holes and a covering mechanism capable of opening and closing the through holes, such that the rectifying plate is at a predefined distance from the column banks, the through holes are disposed in at least a range facing the column banks in plan view of the substrate, and a portion or all of the through holes are closed by the covering mechanism for a predefined time. The method further includes operating the covering mechanism to open the through holes. The method further includes exhausting gas from an environment including the substrate and the rectifying plate. The method further includes drying the ink by heating the substrate, to form an organic functional layer. The method further includes forming a counter electrode layer above the organic functional layer after removing the rectifying plate.

As a result, ink in the gaps moves in the column direction, levelling variation in film thickness for a predefined time, reducing variation in film thicknesses along the column direction of ink application caused by factors such as variation in ink ejection amount and non-ejection of ejection ports. As a result, suppressing film thickness variation caused by (1) imbalance of solvent evaporation rate due to vapor concentration distribution of ink solvent in the central portion and the peripheral portion in the row and column directions of the substrate, and (2) imbalance of ink surface tension in the central portion and the peripheral portion in the column direction is possible.

As a result, further reduction in luminance unevenness caused by nonuniformity of film thickness of the light emitting layers in peripheral and central portions of the film forming area is possible.

1. Overall Configuration of Display Panel 10

1.1 Overview

Display panel 10 pertaining to at least one embodiment is described with reference to the drawings. The drawings are schematic diagrams and actual scale may differ.

FIG. 1 is a schematic plan view of the display panel 10 according to at least one embodiment.

The display panel 10 is an organic EL display panel that uses electroluminescence of an organic compound, has organic EL display elements 100, which form pixels, disposed in a matrix on a substrate 100x (thin film transistor (TFT) substrate) on which TFTs are arranged. The display panel 10 has a top-emission configuration, emitting light from an upper surface. Here, in the present disclosure, an X direction, Y direction, and Z direction in FIG. 1 correspond to a row direction, column direction, and thickness direction of the display panel 10, respectively.

In FIG. 1, the display panel 10 has a partitioned region 10a (the X direction and the Y direction are labelled 10Xa and 10Ya, respectively, and 10a is used where the distinction is unnecessary) in which column banks 522Y and row banks 122X are disposed, partitioning the substrate 100x into a matrix and defining light emitting units of each color RGB, and a non-partitioned region 10b (the X direction and the Y direction are labelled 10Xb and 10Yb, respectively, and 10b is used where the distinction is unnecessary) surrounding the partitioned region 10a. Outer peripheral edges in the column direction of the partitioned region 10a correspond to ends 522Ye in the column direction of the column banks 522Y. In the non-partitioned region 10b is formed a sealing member 300 that is rectangular and surrounds the partitioned region 10a. Further, the partitioned region 10a includes a display element region 10e including a substrate center and a non-light emitting region 10ne surrounding the display element region 10e. The display element region 10e is a region in which the organic EL display element 100 is formed in each section defined by the column banks 522Y and the row banks 122X; and the non-light emitting region 10*ne* is a region in which the organic EL display element 100 is not formed in each section. Further, in at least one embodiment, length in the X and Y directions of the non-light emitting region 10*ne* is from two to ten times length in the X and Y directions of a sub pixel 100*se* region surrounded by adjacent ones of the column banks 522Y and adjacent ones of the row banks 122X. According to at least one embodiment, the length is four times greater in both the X and Y directions.

1.2 Configuration of Display Element Region 10*e*

Figure 2:
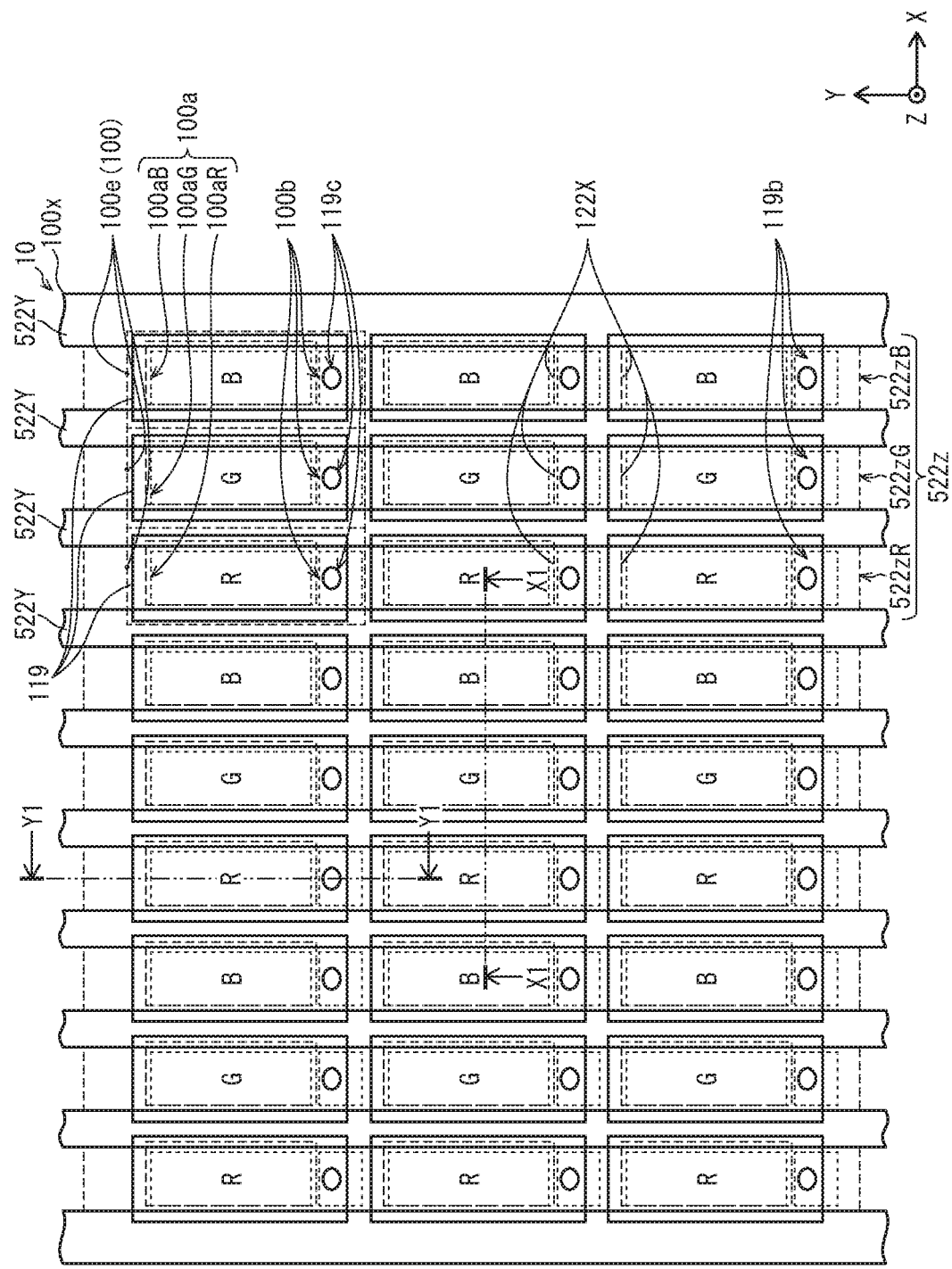
FIG. 2 is an enlarged plan view of portion X0 in FIG. 1 according to at least one embodiment.

FIG. 2 is an enlarged plan view of portion X0 in FIG. 1 according to at least one embodiment.

In the display element region 10*e* of the display panel 10, unit pixels 100*e* corresponding to the organic EL display element 100 are arranged in a matrix. In each of the unit pixels 100*e* are three auto light emitting regions 100*a*, which are regions that emit light via an organic compound, a red light emitting region 100*a*R, a green light emitting region 100*a*G, and a blue light emitting region 100*a*B (hereinafter, where a distinction between 100*a*R, 100*a*G, and 100*a*B is not necessary, 100*a* is used). That is, three sub pixels 100*se* corresponding to auto light emitting regions 100*a*R, 100*a*G, and 100*a*B lined up in the row direction in FIG. 2 are one set, and make up one of the unit pixels 100*e* in a color display.

Further, in FIG. 2, pixel electrode layers 119 are arranged in a matrix on the substrate 100*x* in a state of being separated from each other by predefined distances in the row and column directions of the display panel 10. Each of the pixel electrode layers 119 has a rectangular shape in plan view. The pixel electrode layers 119 arranged in a matrix correspond to the three auto light emitting regions 100*a*R, 100*a*G, 100*a*B lined up in the row direction.

In the display panel 10, shapes of the banks 122 are that of a so-called line-like insulating layer form. The column banks 522Y extend in the column direction (Y direction in FIG. 2) and are lined up in the row direction above regions on the substrate 100*x* between outer edges in the row direction of two adjacent ones of the pixel electrode layers 119 in the row direction.

On the other hand, the row banks 122X extend in the row direction (X direction in FIG. 2) and are lined up in the column direction above regions on the substrate 100*x* between outer edges in the column direction of two adjacent ones of the pixel electrode layers 119 in the column direction. A region in which the row banks 122X are formed becomes a non-auto light emitting region 100*b*, because organic electroluminescence does not occur in light emitting layers 123 above the pixel electrode layers 119. Thus, edges in the column direction of the auto light emitting regions 100*a* are defined by edges in the column direction of the row banks 122X.

Where a gap 522*z* between adjacent ones of the column banks 522Y is defined, a red gap 522*z*R corresponding to the auto light emitting region 100*a*R, a green gap 522*z*G corresponding to the auto light emitting region 100*a*G, or a blue gap 522*z*B corresponding to the auto light emitting region 100*a*B exists (hereinafter, where distinction between gap 522*z*R, gap 522*z*G, and gap 522*z*B is not required, "gap 522*z*" is used), and in the display panel 10 the column banks 522Y and the gaps 522*z* alternate in the row direction.

Further, in FIG. 2, in the display panel 10, the auto light emitting regions 100*a* and the non-auto light emitting regions 100*b* alternate in the column direction along the gap 522*z*. In the non-auto light emitting region 100*b*, there is a connecting recess 119*c* (contact hole) that connects one of the pixel electrode layers 119 to a source of a TFT, and a contact region 119*b* (contact window) on the pixel electrode layer 119 for electrical connection to the pixel electrode layer 119.

Further, for one sub pixel 100*se*, the column banks 522Y and the row banks 122X intersect, and the auto light emitting region 100*a* is disposed between the row banks 122X in the column direction.

2. Component Configuration of Display Panel 10

Figure 3:
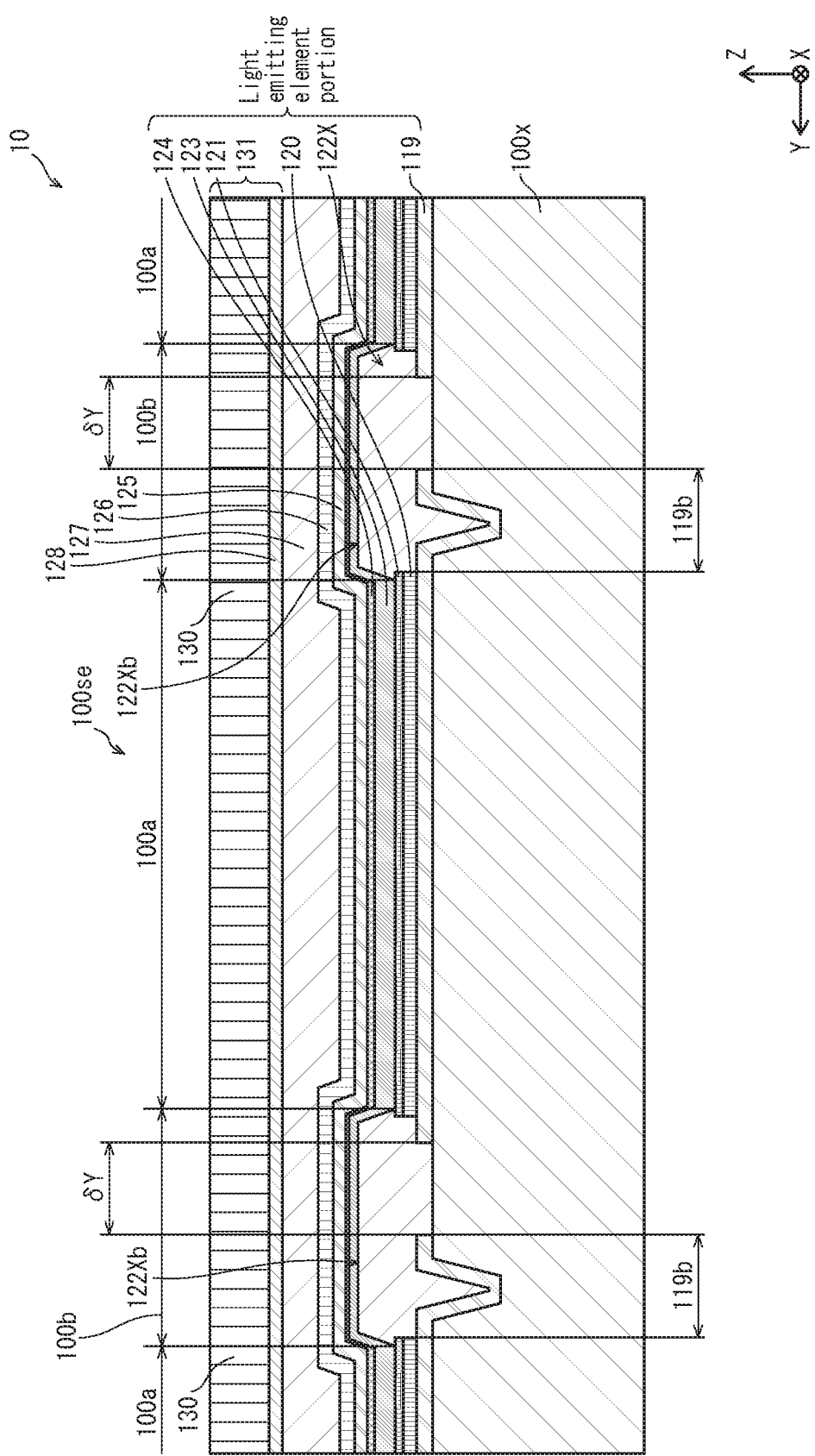
FIG. 3 is a schematic cross section taken through Y1-Y1 in FIG. 2 according to at least one embodiment.
Figure 4:
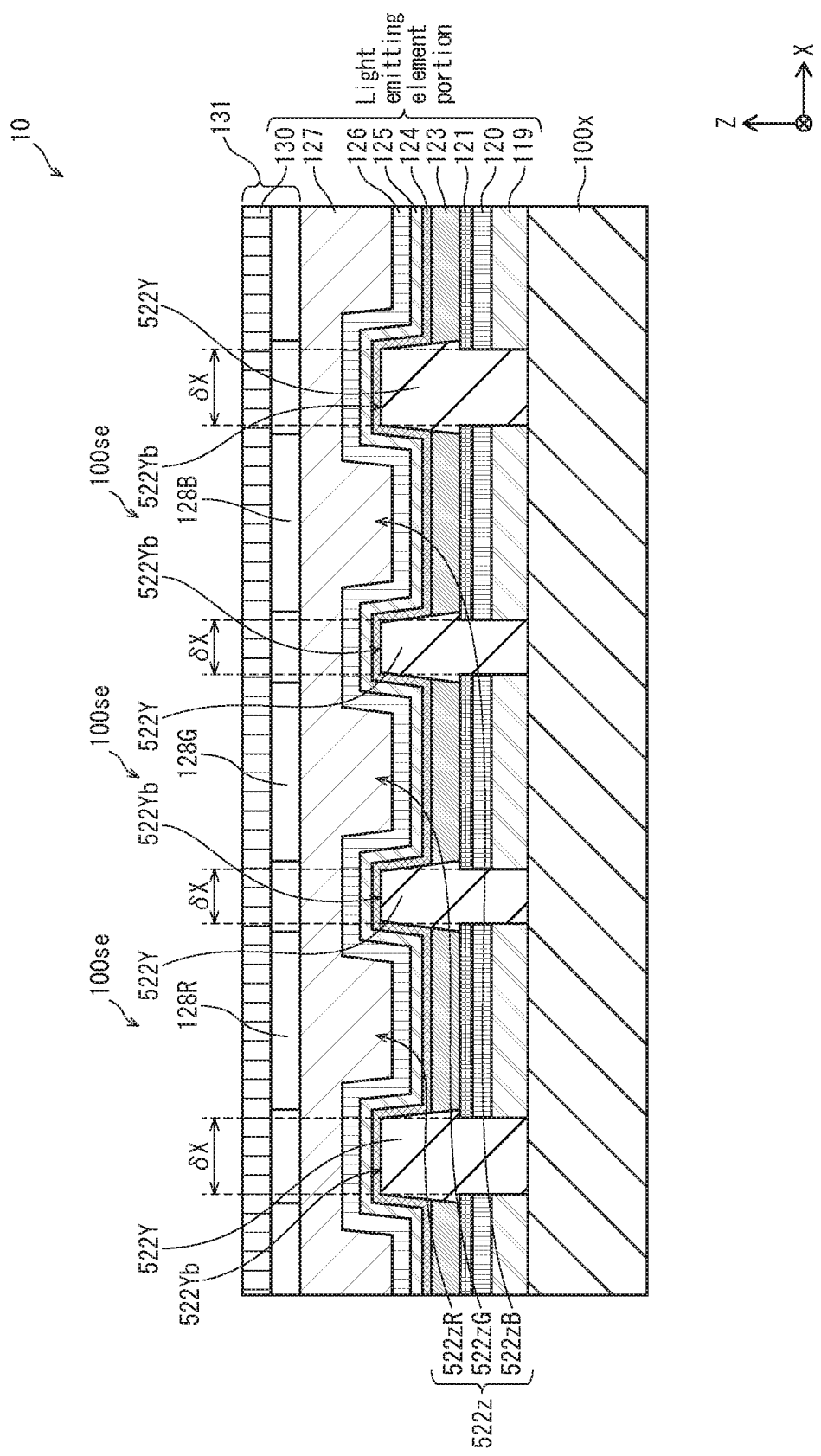
FIG. 4 is a schematic cross section taken through X1-X1 in FIG. 2 according to at least one embodiment.

Configuration of the organic EL display element 100 in the display panel 10 is described with reference to the schematic cross sections of FIG. 3 and FIG. 4. FIG. 3 is a schematic cross section taken along Y1-Y1 in FIG. 2 according to at least one embodiment. FIG. 4 is a schematic cross section taken along X1-X1 in FIG. 2 according to at least one embodiment.

The display panel 10 pertaining to at least one embodiment is configured such that the substrate 100*x* (TFT substrate) on which a thin film transistor is formed is lower in the Z axis direction, above which is an organic EL element portion.

(1) Substrate 100*x* (TFT Substrate)

The substrate 100*x* is a support member of the display panel 10, and has a base (not illustrated), a TFT layer (not illustrated) on the base material, and an interlayer insulating layer (not illustrated) on the TFT layer and the base material.

The base is a support member of the display panel 10, and is a flat plate. As a material of the base, an electrically insulating material can be used, such as a glass material, a resin material, a semiconductor material, or a metal material coated with an insulating layer. As examples, a glass substrate, a silica glass substrate, a silicon substrate, a metal substrate of a metal such as molybdenum sulfide, copper, zinc, aluminum, stainless steel, magnesium, iron, nickel, gold, or silver, a semiconductor substrate such as gallium arsenide, a plastic substrate, or similar.

The TFT layer includes TFTs and wires formed on an upper layer of the base. A TFT, in accordance with a drive signal from an external circuit of the display panel 10, electrically connects one of the pixel electrode layers 119 to an external power source, and is a multilayer structure including layers such as an electrode, a semiconductor layer, and an insulating layer. The wires electrically connect the TFTs, the pixel electrode layers 119, the external power source, external circuits, and the like.

The insulating layer disposed on an upper surface of the substrate 100*x* planarizes at least the sub pixels 100*se* on the upper surface of the substrate 100*x*, which would otherwise be uneven due to the TFT layer. Further, the interlayer insulating layer fills space between the wiring and TFTs and electrically insulates the wiring and TFTs.

For the interlayer insulating layer above the TFTs, silicon oxide ($SiO_2$), silicon nitride (SiN) and silicon oxynitride (SiON), or silicon oxide (SiO) and silicon oxynitride (SiON) can be used, for example.

As a connecting electrode layer of a TFT, a layered body of molybdenum (Mo), copper (Cu), and copper manganese (CuMn) can be used, for example. The interlayer insulating layer disposed on an upper surface of the substrate 100*x* is formed by using an organic compound such as polyimide resin, acrylic resin, siloxane resin, novalac-type phenolic resin, or the like. Film thickness of the interlayer insulating layer can be in the range from 2000 nm to 8000 nm.

(2) Pixel Electrode Layers 119

On the interlayer insulating layer disposed on the upper surface of the substrate 100*x*, the pixel electrode layers 119 are provided in units of the sub pixels 100*se*. The pixel electrode layers 119 supply carriers to the light emitting layers 123, for example if the pixel electrode layers function as anodes, they supply holes to the light emitting layers 123. Each of the pixel electrode layers 119 is a rectangular flat plate shape, and the pixel electrode layers 119 are disposed on the substrate 100x with an interval δX between them in the row direction and in the gaps 522z with an interval δY between them in the column direction. Further, for each of the pixel electrode layers 119, the connecting recess 119c that is recessed in the direction of the substrate 100x is connected to a source of a TFT via a contact hole provided to an upper surface of the substrate 100x.

The pixel electrode layers 119 include a metal material. In the case of top-emission, chromaticity of emitted light is adjusted by adoption of an optical resonator structure for which film thickness is optimally set to increase luminance, and therefore a surface portion of the pixel electrode layers 119 has a high reflectivity. The pixel electrode layers 119 may have a structure in which a plurality of films selected from a metal layer, an alloy layer, and a transparent conductive layer are layered. The metal layer can include a metal material including silver (Ag) or aluminum (Al). The alloy layer can be made using a silver, palladium, and copper alloy (APC), a silver, rubidium, gold alloy (ARA), a molybdenum chromium alloy (MoCr), a nickel chromium alloy (NiCr), or the like. The transparent conductive layer can be made using indium tin oxide (ITO), indium zinc oxide (IZO), or the like.

(3) Hole Injection Layers 120, Hole Transport Layers 121

The hole injection layers 120 and the hole transport layers 121 are layered in this order on the pixel electrode layers 119, each of the hole transport layers 121 being in contact with one of the hole injection layers 120. The hole injection layers 120 and the hole transport layers 121 have a function of transporting holes injected from the pixel electrode layers 119 to the light emitting layers 123.

Each of the hole injection layers 120 is a layer includes an oxide such as silver (Ag), molybdenum (Mo), chromium (Cr), vanadium (V), tungsten (W), nickel (Ni), iridium (Ir), or the like, or an electrically conductive polymer material such as poly(3,4-ethylenedioxythiophene) polystyrene sulfonate (PEDOT:PSS) or the like.

The hole transport layers 121 can be made using a polymer compound such as polyfluorene, a derivative thereof, polyarylamine, a derivative thereof, or the like.

(4) Banks 122

The banks 122 are made of an insulator and are formed to cover edges of the pixel electrode layers 119, the hole injection layers 120, and the hole transport layers 121. The banks 122 include the column banks 522Y extending in the column direction and arranged along the row direction and the row banks 122X extending in the row direction and arranged along the column direction. In FIG. 2, the column banks 522Y intersect the row banks 122X, forming a lattice shape (hereinafter, the row banks 122X and the column banks 522Y are collectively referred to as "banks 122" in some instances). Further, an upper surface 522Yb of the column banks 522Y is positioned higher than an upper surface 122Xb of the row banks 122X.

The row banks 122X each have a line-like shape extending in the row direction, and in cross section taken along the column direction have a tapered trapezoidal shape tapering upwards. The row banks 122X extend in the row direction, perpendicular to the column direction, passing through the column banks 522Y. Thus, the row banks 122X and the column banks 522Y form openings corresponding to the auto light emitting regions 100a.

The row banks 122X are for controlling flow in the column direction of ink containing an organic compound that is a material of the light emitting layers 123. Thus, the row banks 122X have lyophilicity with respect to the ink that is not less than a predefined value. According to this configuration, fluidity of the ink in the column direction is increased to suppress variation of applied ink amount between sub pixels. The pixel electrode layers 119 are not exposed by the row banks 122X and regions in which the row banks 122X are present do not emit light and do not contribute to luminance.

When an upper limit of film thickness of the row banks 122X is thicker than 2000 nm, wet spreading of the ink is poor, and when 1200 nm or less, wet spreading of the ink is further improved. Further, when a lower limit of film thickness is at least 100 nm, end portions of the pixel electrode layers 119 are covered by the banks 122, and the pixel electrode layers 119 and a counter electrode layer 125 can be manufactured at a constant yield without short-circuits. When the lower limit of film thickness is at least 200 nm, short defects are reduced making stable manufacturing possible. In a case in which connecting groove portions are provided in the banks 122, the same applied to film thickness at a bottom of the groove portions.

Accordingly, in at least one embodiment, thickness of the row banks 122X ranges from 100 nm to 2000 nm. In at least one embodiment, thickness of the row banks 122X ranges from 200 nm to 1200 nm. According to at least one embodiment, thickness of the row banks 122X is approximately 1000 nm.

The column banks 522Y block flow of the ink in the row direction to define row direction outer edges of the light emitting layers 123. The column banks 522Y each have a line-like shape extending in the column direction, and in cross section taken along the row direction have a tapered trapezoidal shape tapering upwards.

The column banks 522Y define outer edges in the row direction of the light emitting region 100a of each of the sub pixels 100se. Thus, the column banks 522Y require liquid repellency with respect to the ink that is not less than a predefined value.

Accordingly, in at least one embodiment, the thickness of the column banks 522Y ranges from 100 nm to 5000 nm. In at least one embodiment, the thickness of the column banks 522Y range from 200 nm to 3000 nm. According to at least one embodiment, the thickness of the column banks 522Y is approximately 2000 nm.

In order to help prevent current leakage in the thickness direction (Z direction) between outer edges of the pixel electrode layers 119 and the counter electrode layer 125, the banks 122 have an insulation property with a volume resistivity of $1 \times 10^6$ Ωcm or more. Thus, as described later, the banks 122 are configured to be made of a predefined insulating material.

The banks 122 are formed by using an organic material such as a resin, and have an insulation property. As examples of organic material used in forming the banks 122, acrylic resin, polyimide resin, novalac-type phenolic resin, and the like may be used. In at least one embodiment, the banks 122 have organic solvent resistance. In at least one embodiment, the banks 122 include acrylic resin, for a low refractive index, which is suitable for a reflector.

Alternatively, in at least one embodiment, when an inorganic material is used for the banks 122, the banks 122 include silicon oxide (SiO), for example, when considering refractive index. Alternatively, inorganic material such as silicon nitride (SiN), silicon oxynitride (SiON), or the like can be used.

As stated above, in at least one embodiment, the banks 122X have a film thickness of approximately 1000 nm. However, film thickness is not limited to this example and can be in a range from 100 nm to 2000 nm, for example. Further, in at least one embodiment, the banks 522Y have a film thickness of approximately 2000 nm. However, film thickness is not limited to this example and can be in a range from 100 nm to 5000 nm, for example.

Further, the banks 122 are subjected to etching processing, baking processing, and the like during the manufacturing process, and include a highly resistant material that does not excessively deform or alter due to such processing in at least one embodiment.

In order to make a surface liquid repellant, the surface can be treated with fluorine. Alternatively, a material containing fluorine may be used in forming the column banks 522Y. In order to lower liquid repellency of a surface of the column banks 522Y, ultraviolet irradiation may be performed on the column banks 522Y, and baking may be performed at a low temperature.

(5) Light Emitting Layer 123

The display panel 10 has a structure in which a large number of the column banks 522Y and the gaps 522z alternate with each other. In the gaps 522z, which are defined by the column banks 522Y, the light emitting layers 123 are formed extending in the column direction. In red gaps 522zR corresponding to auto light emitting regions 100aR, green gaps 522zG corresponding to auto light emitting regions 100aG, and blue gaps 522zR corresponding to auto light emitting regions 100aB, light emitting layers 123 that emit corresponding colors of light are formed.

Each of the light emitting layers 123 is a layer including an organic compound, and has a function of emitting light via internal recombination of holes and electrons.

Only portions of the light emitting layers 123 that are supplied carriers from the pixel electrode layers 119 emit light, and therefore in regions in which the row banks 122X intervene, the row banks 122X being insulators, electroluminescence of the organic compound does not occur. Thus, only portions of the light emitting layers 123 where the row banks 122X are not present emit light, such portions correspond to the auto light emitting regions 100a, and outer edges of each of the auto light emitting regions 100a in the column direction are defined by column-direction outer edges of the row banks 122X.

Portions of the light emitting layers 123 above side surfaces and upper surfaces 122Xb of the row banks 122X, including the contact regions 119b, do not emit light, and such portions correspond to the non-auto light emitting regions 100b. The light emitting layers 123 are disposed on an upper surface of the hole transport layers 121 in the auto light emitting regions 100a, and are disposed on upper and side surfaces of the row banks 122X in the non-auto light emitting regions 100b.

In FIG. 3, the light emitting layers 123 extend continuously not only in the auto light emitting regions 100a but also across adjacent ones of the non-auto light emitting regions 100b. In this way, when forming the light emitting layers 123, ink applied to the auto light emitting regions 100a can flow in the column direction via ink applied to the non-auto light emitting regions 100b, making equalizing of film thickness between pixels in the column direction possible. However, in the non-auto light emitting regions 100b, ink flow is suppressed to an appropriate extent by the row banks 122X. Accordingly, large amounts of unevenness in film thickness in the column direction is unlikely to occur, and luminance unevenness between pixels is improved.

As a material used for forming the light emitting layers 123, a light emitting organic material that can be made into a film by a wet printing method is used.

More specifically, as described in JPH5-163488, for example, the light emitting layers 123 include a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, or rare earth metal complex.

(6) Electron Transport Layer 124

In openings defined by the row banks 122X and the column banks 522Y, the electron transport layer 124 is formed on the light emitting layers 123. Further, according to at least one example, the electron transport layer 124 is also disposed on the upper surfaces 522Yb of the column banks 522Y that are not covered by the light emitting layers 123. The electron transport layer 124 has a function of transporting electrons injected from the counter electrode layer 125 to the light emitting layers 123. The electron transport layer 124 includes, for example, an oxadiazole derivative (OXD), a triazole derivative (TAZ), a phenanthroline derivative (BCP, Bphen), or the like.

(7) Counter Electrode Layer 125

The counter electrode layer 125 is formed covering the electron transport layer 124. The counter electrode layer 125 is formed to be continuous across the display panel 10, and may be connected to bus bar wiring (not illustrated) for each pixel or each unit of a number of pixels. The counter electrode layer 125 forms a conduction path paired with the pixel electron layers 119, sandwiching the light emitting layers 123. The counter electrode layer 125 supplies carriers to the light emitting layers 123, for example in the case of the counter electrode layer 125 functioning as a cathode, the counter electrode layer 125 supplies electrons to the light emitting layers 123. The counter electrode layer 125 is formed following a surface of the electron transport layer 124, and forms an electrode common to all the light emitting layers 123. The counter electrode layer 125 is made of an electrically conductive light transmissive material. For example, indium tin oxide (ITO), indium zinc oxide (IZO), or the like can be used. Alternatively, an electrode of thin film silver (Ag), aluminum (Al), or the like may be used.

(8) Sealing Layer 126

The sealing layer 126 is formed covering the counter electrode layer 125. The sealing layer 126 is for suppressing deterioration of the light emitting layers 123 due to contact with moisture, air, and the like. The sealing layer 126 is provided covering an upper surface of the counter electrode layer 125, across the display panel 10. The sealing layer 126 can be formed using a light-transmissive material such as silicon nitride (SiN), silicon oxynitride (SiON), or the like. Further, in addition to a layer includes a material such as silicon nitride (SiN), silicon oxynitride (SiON), or the like, a sealing resin layer may be provided, the sealing resin layer includes a resin material such as acrylic resin, silicone resin, or the like.

(9) Joining Layer 127

Above the sealing layer 126 in the Z axis direction is a color filter (CF) substrate 131. The CF substrate includes an upper substrate 130 and, on a lower side surface of the upper substrate in the Z axis direction, a color filter layer 128. The CF substrate 131 is joined to the sealing layer 126 by a joining layer 127. The joining layer 127 has a function of joining a "back panel" formed by each layer from the substrate 100x to the sealing layer 126 to the CF substrate 131, and has a function of preventing each layer from being exposed to moisture or air. The joining layer 127 can be made of a light transmissive resin material such as acrylic resin, silicone resin, epoxy resin, or the like.

(10) Upper Substrate 130

The CF substrate 131, which includes the upper substrate 130 and the color filter layer 128, is disposed above and joined to the joining layer 127. The display panel 10 is a top-emission type of panel, and therefore the upper substrate 130 can include a light transmissive material such as cover glass, light transmissive resin film, or the like. Further, the upper substrate 130 can improve rigidity of the display panel 10, and help prevent intrusion of moisture, air, and the like. As a light transmissive material, a glass substrate, a silica glass substrate, a plastic substrate, or the like can be used.

(11) Color Filter Layer 128

The color filter layer 128 is formed on the upper substrate at positions corresponding to the auto light emitting regions 100a of pixels. The color filter layer 128 is a light transmissive layer provided for allowing transmission of visible light of wavelengths corresponding to R, G, and B and has a function of transmitting light emitted from each color pixel and correcting chromaticity of the transmitted light. For example, according to at least one embodiment, red, blue, and green color filter layers 128R, 128G, and 128B are formed above the auto light emitting regions 100aR in the red gaps 522zR, the auto light emitting regions 100aG in the green gaps 522zG, and the auto light emitting regions 100aB in the blue gaps 522zB, respectively. The color filter layer 128, more specifically, is formed by application of ink to the upper substrate 130, which is cover glass formed with a matrix of openings that correspond to pixels, the ink containing color filter material and solvent.

3. Ink Drying Device (1) Overall Configuration

Figure 5:
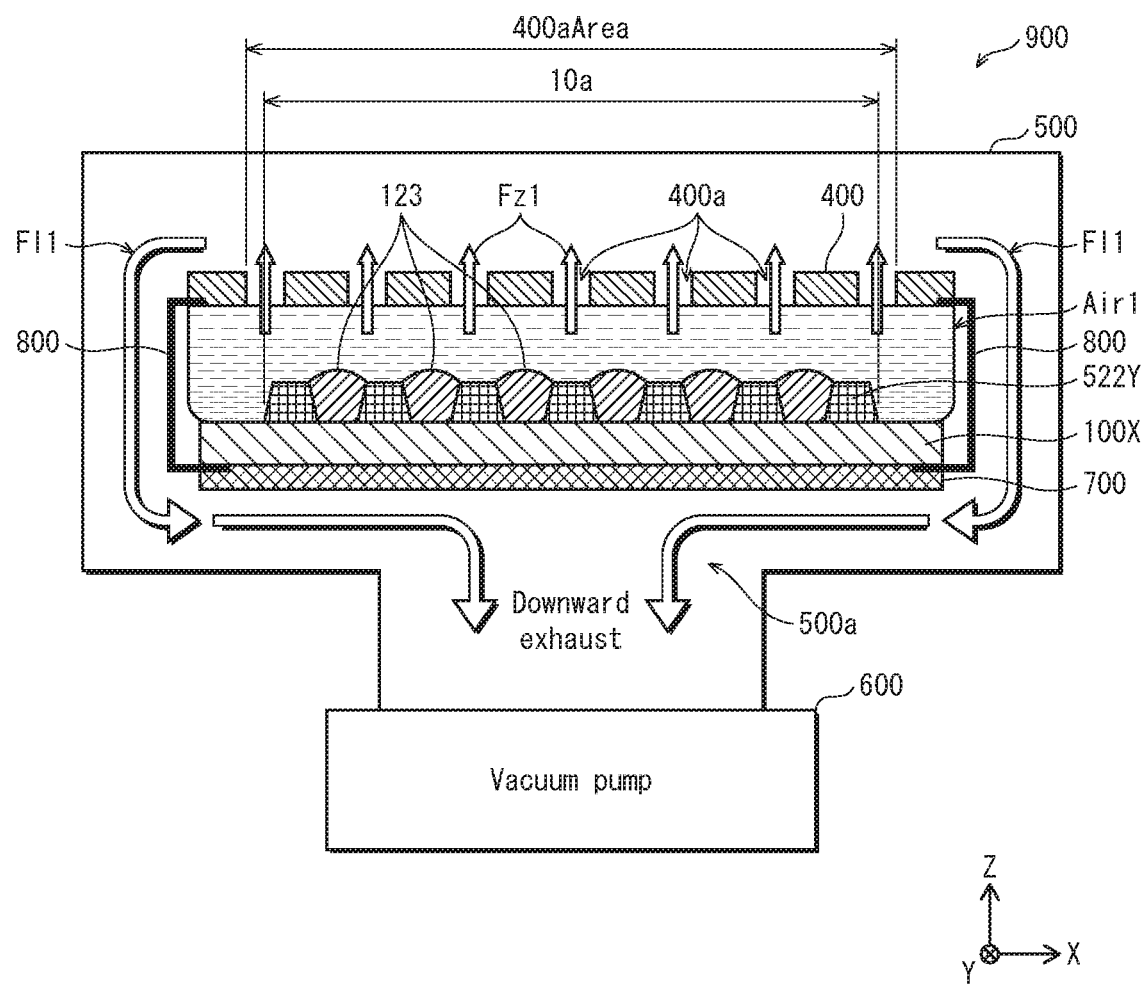
FIG. 5 is a schematic cross section of ink drying device 900 usable in method of manufacturing organic EL display panel 10 pertaining to at least one embodiment.

The following describes configuration of an ink drying device used in the method of manufacturing the display panel 10. FIG. 5 is a schematic cross section of an ink drying device 900 used in the method of manufacturing the organic EL display panel 10 according to at least one embodiment.

The ink drying device 900 is a device for manufacturing the light emitting layers 123, in an ink drying process described layer, by a drying and baking process applied to ink containing organic light emitting material under reduced pressure, the ink filling the gaps 522z between the column banks 522Y on the substrate 100x.

In FIG. 5, the ink drying device 900 includes a chamber 500 that accommodates the substrate 100x with ink containing organic light emitting material applied in the gaps 522z between the column banks 522Y, and a support base 700 on which the substrate 100x is placed in the chamber 500. The ink drying device 900 further includes a rectifying plate 400 arranged opposite the substrate 100x, separated from the column banks 522Y by a predefined distance, and a spacer 800 that is a holding means for holding the rectifying plate 400 at the predefined distance from the column banks 522Y opposite the substrate 100x. The ink drying device 900 further includes a vacuum pump 600 that is connected to the chamber 500 and sucks gas from the chamber 500 to exhaust the gas out of the chamber 500, and a heater (not illustrated) that heats the substrate 100x on the support base 700. The heater can be a hotplate disposed on the support base 700, and can be an oven that heats the interior of the chamber 500.

The support base 700 is made of a very heat resistance metal or ceramic. The support base 700 is movable in both directions in an out of the chamber 500 via a drive unit (not illustrated).

The rectifying plate 400 includes a ceramic or a metal having solvent resistance, such as stainless steel, aluminum, copper, iron, or the like, and has through holes 400a. The rectifying plate 400 is configured to be movable in both directions along the Z axis above the support base 700 via an elevation unit (not illustrated).

The spacer 800, which is a holding unit, is a gap forming unit made of metal columns provided in the vicinity of an outer periphery of the support base 700. When the rectifying plate 400 moves downward via the elevation unit and comes close to the support base 700, the spacer 800 holds the rectifying plate 400 and thereby regulates the gap between the support base 700 and the rectifying plate 400.

In at least one embodiment, an opening 500a to an exhaust path to the vacuum pump 600 in the chamber 500 is located below the support base 700. In FIG. 5, a gas current can be formed that wraps around the support base 700 and the rectifying plate 400, and vapor Air1 can be exhausted upwards through the rectifying plate 400 at a more uniform speed via the through holes 400a in a partitioned region 10a in which the column banks 522Y and the row banks 122X are disposed, which regulate light emitting units in the colors R, G, and B.

(2) Rectifying Plate 400

Figure 6A:
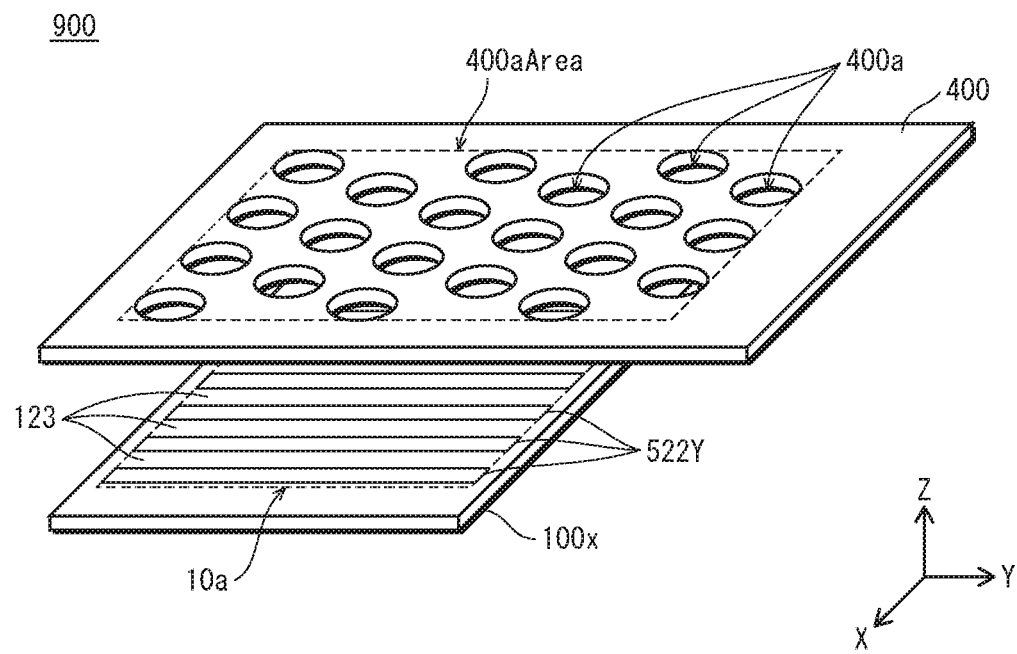
FIG. 6A is a schematic perspective view showing positions of rectifying plate 400 and substrate 100x relative to each other in ink drying device 900 according to at least one embodiment.
Figure 6B:
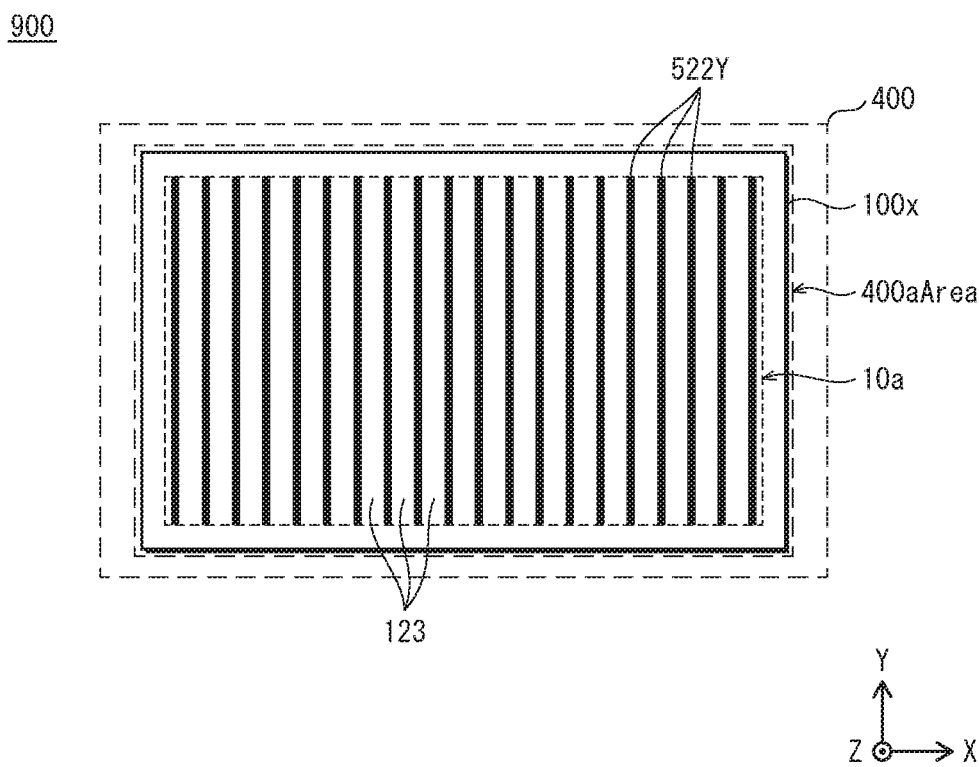
FIG. 6B is a schematic plan view of substrate 100x shown through a transparent rectifying plate 400 according to at least one embodiment.

The following is a detailed description of the rectifying plate 400. FIG. 6A is a schematic perspective view showing positions of the rectifying plate 400 and the substrate 100x relative to each other in the ink drying device 900 according to at least one embodiment. FIG. 6B is a schematic plan view of the substrate 100x shown through the rectifying plate 400 according to at least one embodiment.

In FIG. 5, FIG. 6A, and FIG. 6B, the rectifying plate 400 is at least larger than the partitioned region 10a of the substrate 100x in the X direction and the Y direction. In a state in which the rectifying plate 400 is disposed opposite the substrate 100x, a region 400a Area in which the through holes 400a are disposed in the rectifying plate 400 at least includes a region opposing the partitioned region 10a of the substrate 100x. For example, in FIG. 6B, the substrate 100x may be included in the region 400a Area.

In at least one embodiment, a total sum of open area of the through holes 400a in a range opposite at least the partitioned region 10a of the substrate 100x ranges from 10% to 60% of area of the partitioned region 10a in which the column banks 522Y and the row banks 122X are disposed. In at least one embodiment, the total sum of open area of the through holes 400a in a range opposite at least the partitioned region 10a of the substrate 100x ranges from 20% to 40%. Further, in at least one embodiment, diameter of each of the through holes 400a ranges from 2 mm to 50 mm. In at least one embodiment, the diameter of each of the through holes 400a ranges from 3 mm to 20 mm. These ranges are for decreasing flow path resistance and improving exhaust balance. By reducing flow path resistance, an excessive increase in time to exhaust gas between the substrate 100x and the rectifying plate 400 is prevented, at which time ink flow occurs in the gaps 522z, helping to prevent unevenness in film thickness occurring in the gaps 522z. Diameter of the through holes 400a may vary in the range opposing the partitioned region 10a, and may be changed according to distribution in the partitioned region 10a. When the rectifying plate 400 is disposed opposite the substrate 100x, in at least one embodiment, a gap between the rectifying plate 400 and the column banks 522Y on the substrate 100x ranges from 3 mm to 50 mm. In at least one embodiment, the gap between the rectifying plate 400 and the column banks 522Y ranges from 5 mm to 20 mm. The through holes 400a are circular, square, hexagonal, or the like. Further, in at least one embodiment, when the shape of the through holes 400a is circular, a ratio of minimum gap between the rectifying plate 400 and the column banks 522Y on the substrate 100x to diameter of the through holes 400a ranges from 0.5 to 2. In at least one embodiment, a ratio of minimum gap between the rectifying plate 400 and the column banks 522Y ranges from 0.8 to 1.5. According to at least one embodiment, the ratio is 1. The through holes 400a may be a shape other than circular, and in such a case the average value of opening length in the X direction and the Y direction is included in an appropriate numerical range of the diameters described above.

The through holes 400a are distributed evenly at least in an area opposing the partitioned region 10a of the substrate 100x. For the rectifying plate 400, in at least one embodiment, the through holes 400a are arranged in a staggered pattern. In a configuration with a staggered arrangement, flow of gas is improved when compared with a configuration with the through holes 400a lined up in the row direction, even with the same open space ratio, which improves uniformity of film thickness of ink layers 123. In a case in which the through holes 400a are arranged in parallel in the row direction, portions of the rectifying plate 400 in which holes are present and portions of the rectifying plate 400 in which holes are not present are clearly distinguished. Further, when compared with a configuration in which the through holes 400a are arranged in a staggered pattern, portions in which no holes are formed are linked in a consolidated area, making a surface area of a region in which no holes are formed in the rectifying plate 400 relatively large. As a result, turbulent flow tends to occur between a panel substrate and rectifying plate at the time of gas exhaustion, which is thought to increase variation in film thickness.

In the staggered arrangement, pitch between adjacent ones of the through holes 400a may be from 20 mm to 30 mm. However, pitch between adjacent ones of the through holes 400a may vary in the region opposing the partitioned region 10a, and may change depending on distribution in the partitioned region 10a.

By restricting the ratio of the gap between the rectifying plate 400 and the column banks 522Y on the substrate 100x to the diameter of the through holes 400a to the range described above, movement in space between the substrate 100x and the rectifying plate 400 of the vapor Air1 of solvent of ink evaporated from the partitioned region 10a of the substrate 100x in a planar direction of the substrate 100x is restricted, and the vapor Air1 of the solvent is exhausted above the rectifying plate 400 via the through holes 400a.

Further, according to at least one embodiment, as described above, diameter and pitch of the through holes 400a realizes a uniform arrangement at least in a region opposing the partitioned region 10a of the substrate 100x. Thus, the vapor Air1 of the solvent of the ink evaporated from the partitioned region 10a is, in the partitioned region 10a, exhausted above the rectifying plate 400 via the through holes 400a at a uniform speed.

Further, when the ratio of the gap between the rectifying plate 400 and the column banks 522Y on the substrate 100x to the diameter of the through holes 400a is within the restrictions described above, either or both of diameter and pitch of the through holes 400a may be distributed across a region at least opposing the partitioned region 10a of the substrate 100x. This helps to control distribution of evaporation rate of the vapor Air1 of the solvent of the ink evaporated from the partitioned region 10a to above the rectifying plate 400 in the partitioned region 10a.

As described above, in an ink drying process using the ink drying device 900, film shape of the light emitting layers 123 to be formed become equivalent in both a peripheral portion and a central portion of a film forming area. That is, suppressing film thickness variation caused by an imbalance in solvent evaporation rate due to uneven vapor concentration distribution of ink solvent in central and peripheral portions of a substrate is possible, and, as described later, when applying ink containing organic light emitting material in column shaped application regions on a substrate, alleviating influence of ink convection caused by an imbalance of ink surface tension in the column shaped application regions is possible.

As a result, in a method of manufacturing the display panel 10 that includes the ink drying process, improvement can be made to luminance unevenness caused by nonuniformity of film thickness of the light emitting layers 123 in peripheral and central portions of the film forming area of the display panel 10.

4. Method of Manufacturing the Display Panel 10

Figure 7:
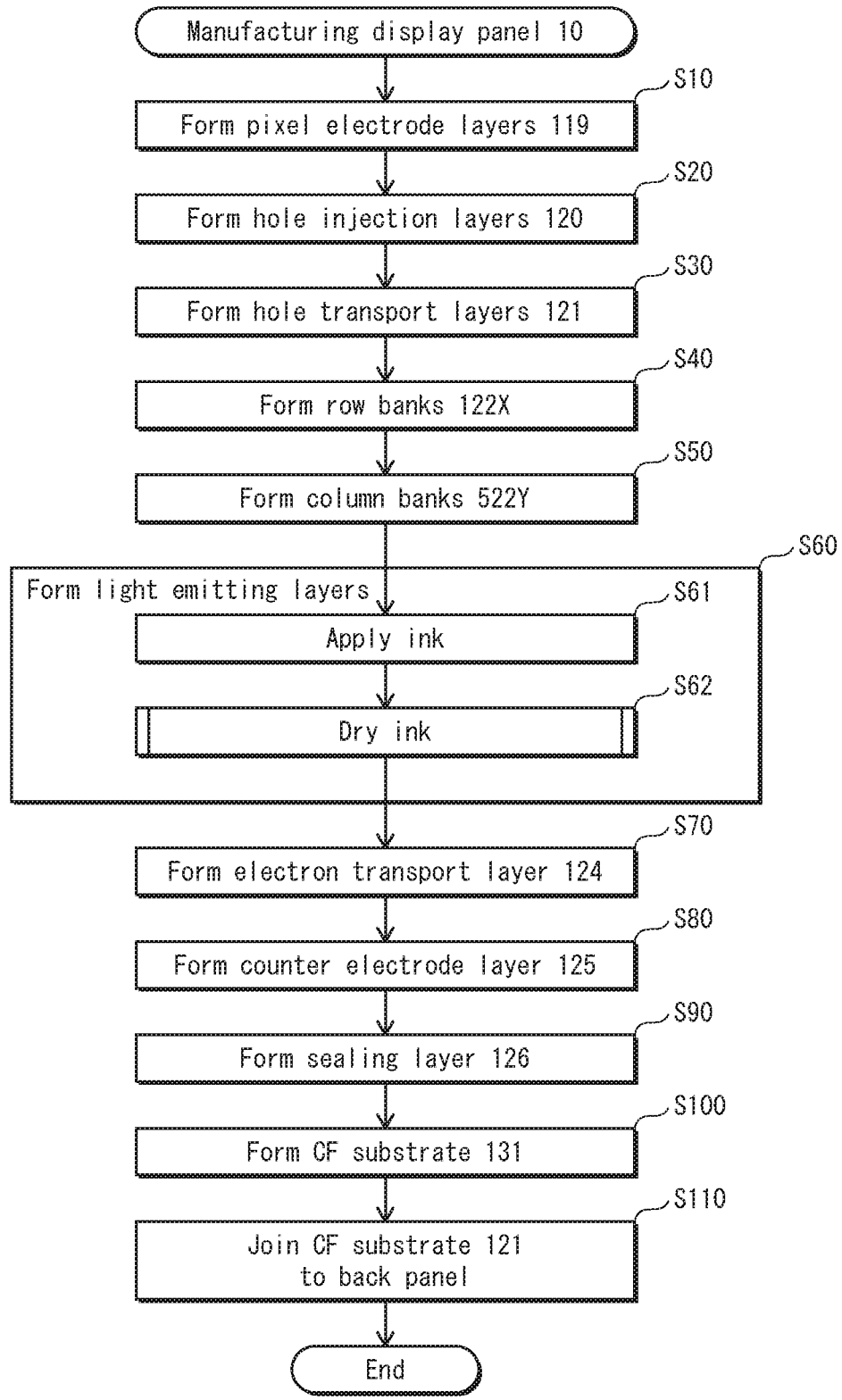
FIG. 7 is a flowchart of a process of manufacturing display panel 10 according to at least one embodiment.

The following describes a method of manufacturing the display panel 10. FIG. 7 shows a process of manufacturing the display panel 10 according to at least one embodiment. FIG. 8A to FIG. 8D, FIG. 13A, and FIG. 13B are schematic cross sections taken at the same position as Y1-Y1 in FIG. 3, showing states in manufacture of the organic EL display panel 10 according to at least one embodiment.

(1) Forming the Pixel Electrode Layers 119

Figure 8A:
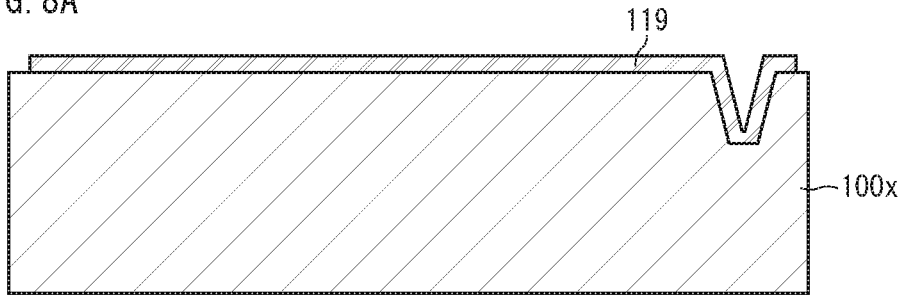
FIG. 8A to FIG. 8D are schematic cross sections taken at the same position as Y1-Y1 in FIG. 3, showing states in manufacture of organic EL display panel 10 according to at least one embodiment.

Initially, in FIG. 7 and FIG. 8A, the TFT substrate 100x is prepared as far as forming an interlayer insulating layer. Contact holes are formed in the interlayer insulating layer, and the pixel electrode layers formed (S10).

The pixel electrode layers 119 are formed by forming a metal film by using sputtering, vacuum deposition, or the like, and then patterning the metal film by using photolithography and etching, or the like. The pixel electrode layers 119 are electrically connected to TFT electrodes.

(2) Forming Hole Injection Layers 120 and Hole Transport Layers 121

Figure 8B:
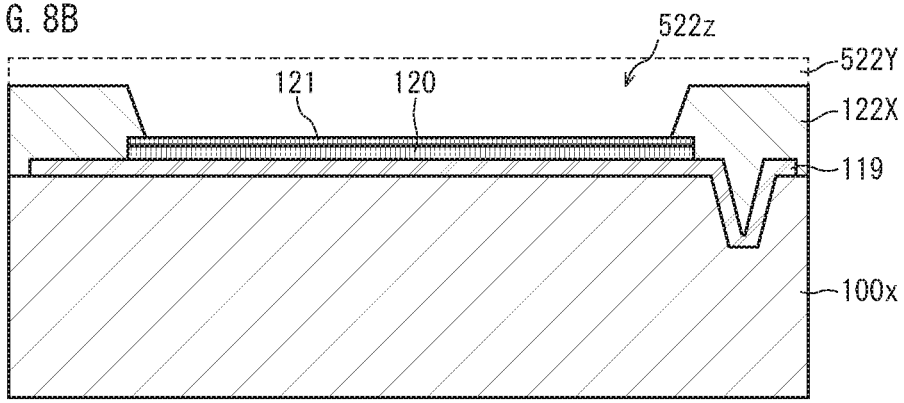

Next, as shown in FIG. 8B, the hole injection layers 120 and the hole transport layers 121 are formed on the pixel electrode layers 119 (steps S20, S30). The hole injection layers 120 and the hole transport layers 121 are formed by forming a film made of a metal oxide (for example, tungsten oxide) by using sputtering or depositing a film made of a metal (for example, tungsten) by using sputtering then oxidating the film by firing. Subsequently, patterning of each pixel unit may be performed by using photolithography and etching.

(3) Forming Banks 122

In FIG. 8B, the banks 122 are formed covering edges of the hole transport layers 121. In forming the banks 122, initially the row banks 122X are formed (step S40), then the column banks 522Y are formed in order to form the gaps 522z that define pixels (step S50). In the gaps 522z, a surface of each of the hole transport layers 121 is exposed between the row banks 122X.

To form the banks 122, first, a film made of a material of the banks 122 (for example, a photosensitive resin material) is layered on the hole transport layers 121. Then the resin film is patterned to form the row banks 122X and the column banks 522Y in order. Patterning of the row banks 122X and the column banks 522Y is performed by exposure to light of the resin film from above while using a photomask, developing, and firing (at approximately 230° C. for 60 min).

More specifically, initially, when forming the row banks 122X, a photosensitive resin film includes an organic photosensitive resin material such as acrylic resin, polyimide resin, novalac-type phenolic resin, or the like is formed by using a spin coating method or the like. After drying to partially volatize solvent, a photomask provided with predefined openings is overlaid, and ultraviolet light irradiation is performed from above to expose a photoresist made of a photosensitive resin or the like, transferring the pattern of the photomask to the photoresist. Next, the photosensitive resin is developed to form patterned insulating layers of the row banks 122X. Typically, a positive type of photoresist is used. A positive type of photoresist is removed by developing portions exposed to light. Portions of the mask pattern that are not exposed to light are not developed, leaving the row banks 122X having a film thickness of approximately 500 nm.

When forming the column banks 522Y, initially, a spin coating method is used to form a film made of material of the column banks 522Y (for example, a photosensitive resin material). Then the resin film is patterned to form the column banks 522Y and the gaps 522z. The gaps 522z are formed by positioning a mask above the resin layer, performing light exposure, and developing. The column banks 522Y extend in the column direction and alternate in the row direction with the gaps 522z.

The column banks 522Y block flow, in the row direction, of ink containing an organic compound that is a material of the light emitting layers 123, in order to define outer edges of the light emitting layers 123 in the row direction, and therefore the column banks 522Y have liquid repellency with respect to the ink of at least a predefined value. On the other hand, in order for the row banks 122X to control flow of the ink in the column direction, the row banks 122X have lyophilicity with respect to the ink of at least a predefined value.

In order to provide surfaces of the column banks 522Y with liquid repellency, surfaces of the column banks 522Y can be CF4 plasma treated. Alternatively, a material containing fluorine may be used in forming the column banks 522Y, or a composition including a material containing fluorine may be used in forming the column banks 522Y.

In terms of manufacturing, an upper limit of film thickness of the row banks 122X of 1000 nm or less further reduces film thickness variation and allows better control of bottom line width. Further, as film thickness becomes thinner, the film thickness and bottom line width are equivalent, and at a lower limit of film thickness of 200 nm or more, obtaining a desired bottom line width due to resolution restrictions is possible. From the perspective of manufacturing, in at least one embodiment, the thickness of the row banks 122X ranges from 200 nm to 1000 nm, for example. According to at least one embodiment, thickness of the row banks 122X is approximately 500 nm.

From the perspective of manufacturing, in at least one embodiment, an upper limit of film thickness of the column banks 522Y is 1500 nm or less, in order to improve productivity due to cost reduction. Further, as film thickness becomes thinner, the film thickness and bottom line width are equivalent, and at a lower limit of film thickness of 1000 nm or more, obtaining a desired bottom line width due to resolution restrictions is possible. In the case of a process involving application of a solution, unevenness of an underlayer improves uniformity of film thickness. Accordingly, the lower limit of film thickness of insulating film is determined by the necessity of reducing step difference of TFTs as much as possible, and, in at least one embodiment, is 500 nm or more. Accordingly, from the perspective of manufacturing, in at least one embodiment, the thickness of the column banks 522Y ranges from 500 nm to 1500 nm, for example. According to at least one embodiment, thickness of the column banks 522Y is approximately 1000 nm.

(4) Forming Light Emitting Layers 123

Figure 8C:
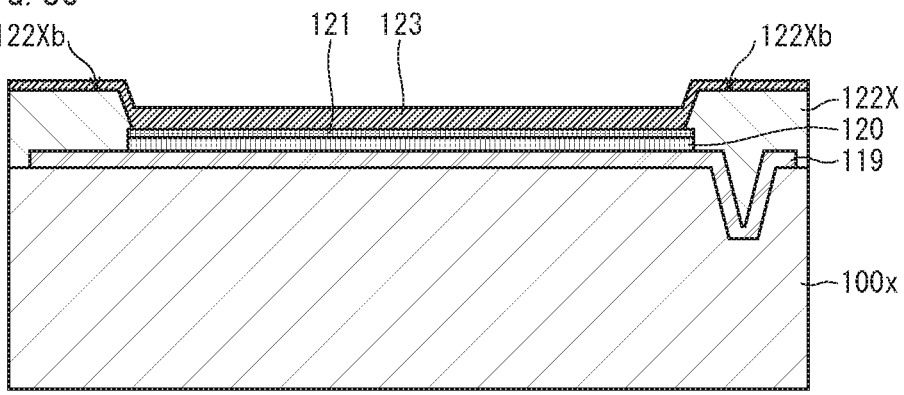

In FIG. 8C, the light emitting layers 123 are layered on the hole transport layers 121 in the gaps 522z defined by the column banks 522Y (step S60).

Forming of the light emitting layers 123 is performed by using an inkjet method to apply ink containing organic light emitting material into the gaps 522z defined by the column banks 522Y (step S61), then drying the ink by baking (step S62).

More specifically, in this process, inks 123RI, 123GI, and 123BI containing R, G, and B organic light emitting layer material, respectively, are applied by an inkjet method to the gaps 522z, which are sub pixel formation regions. The inks are then dried under reduced pressure and baked to form the light emitting layers 123R, 123G, and 123B (FIG. 8C).

(4-1) Ink Application Method (Step S60)

In application of ink of the light emitting layers 123, first, a solution for forming the light emitting layers 123 is applied by using a droplet ejecting device. Upon completion of application of ink for forming any one of the red light emitting layers, the green light emitting layers, and the blue light emitting layers on the substrate 100x, another color of ink is applied to the substrate 100x, then the third color of ink is applied to the substrate 100x, and in this way the three colors of ink are applied in sequence. As a result, red light emitting layers, green light emitting layers, and blue light emitting layers alternate across the substrate 100x.

Figure 9:
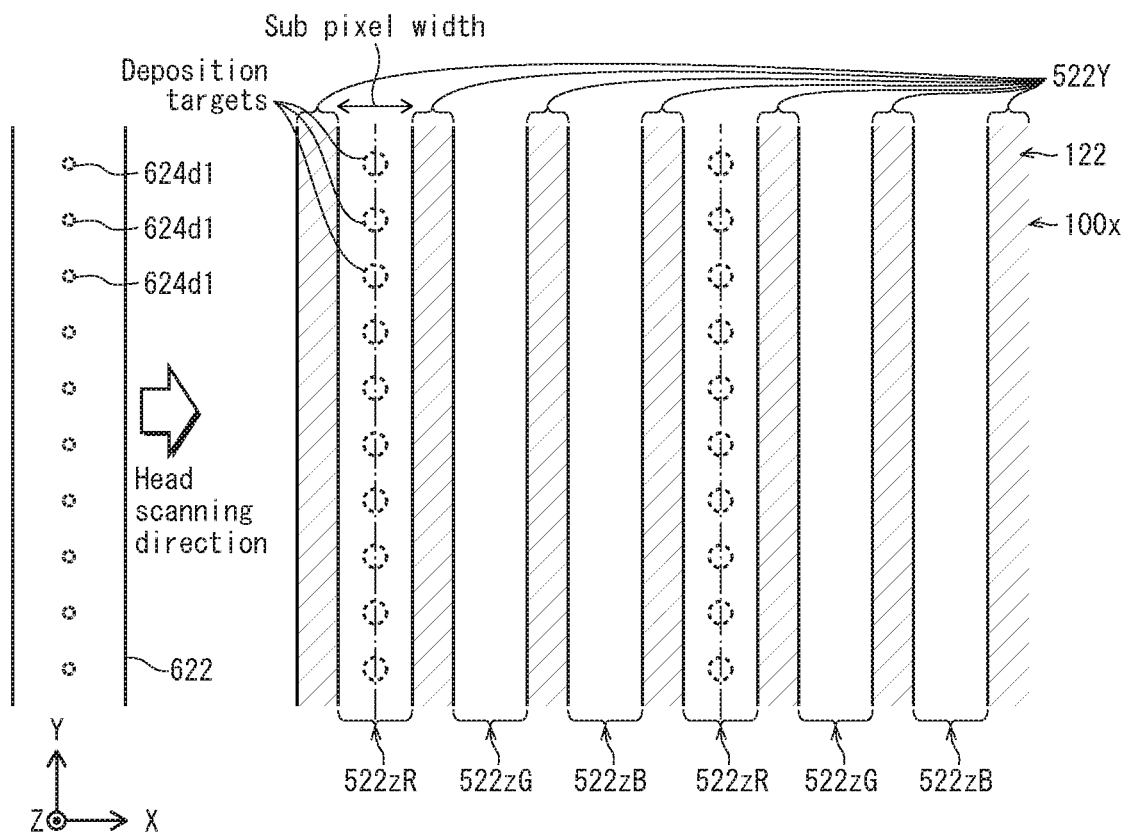
FIG. 9 is a diagram of applying ink for forming light emitting layers on a substrate during manufacture of organic EL display panel 10, in which the ink is applied to grid-like regions defined by banks 122X and 522Y according to at least one embodiment.

The following describes in detail an inkjet method for applying inks of the light emitting layers 123 into the gaps 522z. FIG. 9 is a schematic diagram showing application of ink for forming light emitting layers on a substrate, in a case of uniformly applying ink to the gaps 522z between the column banks 522Y according to at least one embodiment.

When forming the light emitting layers 123, using inks that are solutions for forming the light emitting layers 123, the light emitting layers 123R in the gaps 522zR for red sub pixels, the light emitting layers 123G in the gaps 522zG for green sub pixels, and the light emitting layers 123B in the gaps 522zB for blue sub pixels are formed in regions between the column banks 522Y. Thicknesses of the light emitting layers 123R, the light emitting layers 123G, and the light emitting layers 123B are different from each other. More specifically, an amount of ink applied into the gaps 522zR is greater than an amount applied to the gaps 522zB and greater than an amount applied to the gaps 522zG, and therefore thickness of the light emitting layers 123R is greater than thickness of the light emitting layers 123B and greater than thickness of the light emitting layers 123G.

In order simplify description, an amount of ink to be ejected from nozzles is set to a first condition, then ink is applied to first color gaps on the substrate, then an amount of ink to be ejected from nozzles is set to a second condition, then ink is applied to second color gaps on the substrate, then an amount of ink to be ejected from nozzles is set to a third condition, then ink is applied to third color gaps on the substrate, and by this method ink is sequentially applied to all three colors of gaps. When application of ink to the first color gaps on the substrate is finished, ink is applied to the second color gaps on the substrate, then ink is applied to the third color gaps on the substrate, thereby sequentially applying inks for three colors of gaps.

Alternatively, inks for three colors of gaps may be sequentially applied such that, when application of ink to the first color gaps of a plurality of substrates is finished, ink is applied to the second color gaps of the plurality of substrates, then ink is applied to the third color gaps of the plurality of substrates.

Alternatively, inks for three colors of gaps on a substrate may be applied such that an amount of ink to be ejected from nozzles is set to a first condition, then ink is applied to a first color gap on the substrate, then an amount of ink to be ejected from nozzles is set to a second condition, then ink is applied to an adjacent second color gap on the substrate, then an amount of ink to be ejected from nozzles is set to a third condition, then ink is applied to an adjacent third color gap on the substrate, then an amount of ink is reset to the first condition, then ink is applied to an adjacent first color gap on the substrate, and so on, until ink is applied to all gaps on the substrate.

(Method of Uniformly Applying Ink to Gaps 522z Between Column Banks 522Y)

The following describes a method of applying ink to the gap of one color (for example, ink for a red gap).

The light emitting layers 123 extend continuously not only in the auto light emitting regions 100a but also across adjacent ones of the non-auto light emitting regions 100b. In this way, when forming the light emitting layers 123, ink applied to the auto light emitting regions 100a can flow in the column direction via ink applied to the non-auto light emitting regions 100b, and film thickness can be equalized between pixels in the column direction. However, in the non-auto light emitting regions 100b, ink flow is suppressed to an appropriate extent by the row banks 122X. Accordingly, large amounts of unevenness in film thickness in the column direction is unlikely to occur, luminance unevenness between pixels is improved, and life of pixels is improved.

In at least one embodiment of the present application method, in FIG. 9, the substrate 100x is placed on a work table of a droplet ejecting device in a state in which the column banks 522Y extend along the Y direction, and an inkjet nozzle head 622 in which ejection openings 624d1 are arranged in a line along the Y direction is scanned across the X direction while ink aimed at deposition targets set in the gaps 522z between the column banks 522Y is deposited from the ejection openings 624d1.

For one application amount, regions to which ink of the light emitting layers 123 are applied are one out of every three regions in the X direction.

Methods of forming the light emitting layers 123 are not limited to these examples, and ink may be dropped and applied by a publicly known method other than an inkjet method or gravure printing method, such as a dispenser method, a nozzle coating method, a spin coating method, intaglio printing, letterpress printing, or the like.

(4-2) Ink Drying Method (Step S62)

Figure 10:
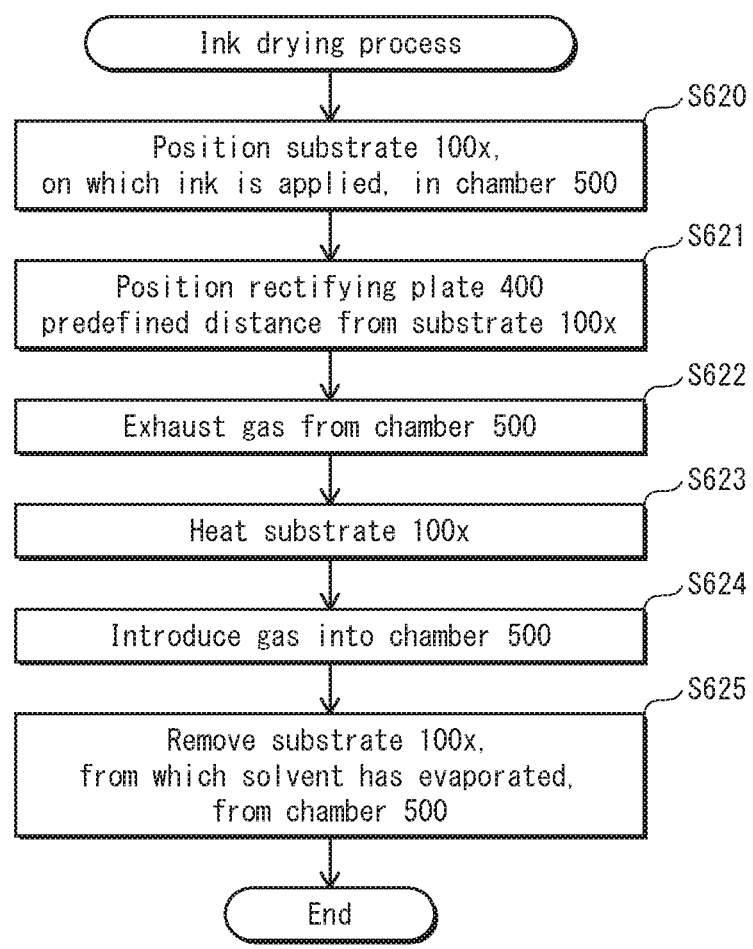
FIG. 10 is a flowchart of a detailed ink drying process in manufacture of organic EL display panel 10 according to at least one embodiment.
Figure 11:
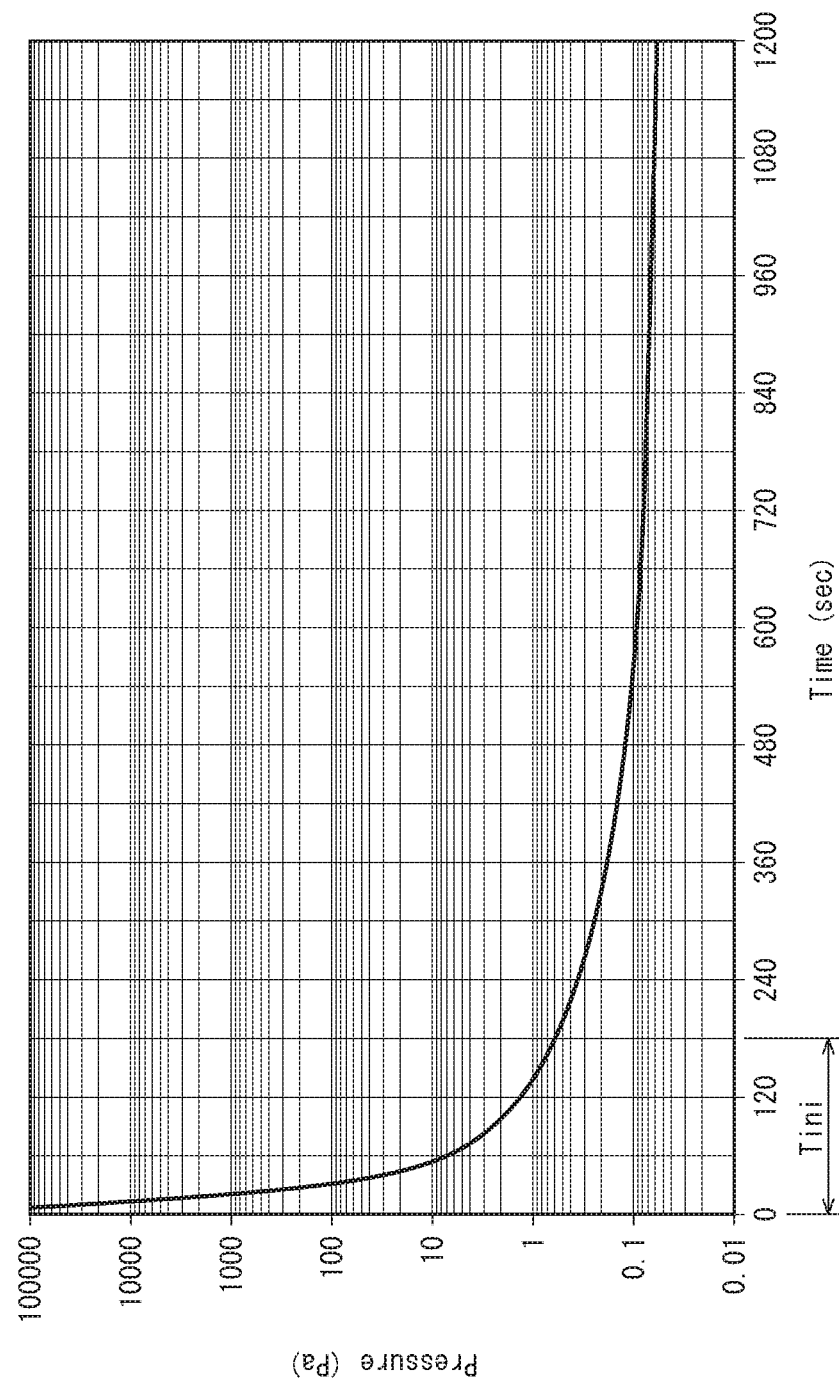
FIG. 11 is a graph of change over time of pressure in a chamber in an ink drying process according to at least one embodiment.

The following describes an ink drying process of drying applied ink by baking. FIG. 10 is a graph of a detailed ink drying process in manufacture of the organic EL display panel 10 according to at least one embodiment. FIG. 11 is a graph of change over time of pressure in a chamber in the ink drying process according to at least one embodiment.

In step S620, the substrate 100x, onto which ink containing organic light emitting material is applied in the gaps 522z between the column banks 522Y, is placed on the support base 700 and the support base 700 is moved into the chamber 500 by a drive unit (not illustrated) so that the substrate 100x is inside the chamber 500.

In step S621, the rectifying plate 400 is moved downward from above in the chamber 500 by the elevation unit (not illustrated), to be held by the spacers 800 provided around the support base 700. As a result, the gap between the support base 700 and the rectifying plate 400 is regulated to a predefined distance, and the gap between the rectifying plate 400 and the column banks 522Y on the substrate 100x is regulated to be in a predefined distance range.

In this state, the vacuum pump 600 is driven to reduce pressure in the chamber 500 from atmospheric pressure to vacuum (step S622). FIG. 11 indicates that change over time of pressure in the chamber 500 in the ink drying process. In FIG. 11, according to at least one embodiment, pressure in the chamber 500 starting from approximately 100 kPa is reduced by $1/10,000$ to approximately 10 Pa in approximately 1 min and by $1/100,000$ to less than 1 Pa in 3 min, and is subsequently reduced to less than 0.1 Pa. In the pressure reduction process, in a time Tini from 2 min to 3 min from the start, air flow is generated from inside the chamber 500 where the support base 700 and the rectifying plate 400 are located to outside the chamber 500, in FIG. 5. Similarly, solvent vapor evaporated from ink applied to the substrate 100x is primarily exhausted from the gap between the substrate 100x and the rectifying plate 400 to outside the chamber 500 in the time Tini.

As above, in the ink drying device 900, the gap between the rectifying plate 400 and the column banks 522Y on the substrate 100x is regulated to a predefined rage, and the ratio of the gap between the rectifying plate 400 and the column banks 522Y to diameter of the through holes 400a is regulated to a predefined range. Further, diameter and pitch of the through holes 400a realizes a uniform arrangement at least in a region opposing the partitioned region 10a of the substrate 100x.

Thus, in the space between the substrate 100x and the rectifying plate 400, vapor of solvent of ink evaporated from the partitioned region 10a of the substrate 100x is suppressed from moving across the substrate 100x and is exhausted above the rectifying plate 400 at a uniform speed through the through holes 400a in the partitioned region 10a.

Next, pressure in the chamber 500 is reduced until the pressure falls to a predefined reference value, is maintained equal to or less than the reference value, and solvent in applied ink is evaporated as the ink is dried. Subsequently, the light emitting layers 123 are formed by applying a baking treatment to the substrate 100x (step S623). The baking treatment is performed by baking under predefined conditions (vacuum baking at a heating temperature of approximately 150° C. for approximately 60 min.

When baking is complete, gas is introduced into the chamber 500 (step S624), the rectifying plate 400 is moved upward by the elevation unit (not illustrated) away from the substrate 100x, the support base 700 is moved outside the chamber 500 by the drive unit (not illustrated), transferring the substrate 100x on which the light emitting layers 123 are formed out of the chamber 500 (step S625) and completing the ink drying process.

(5) Forming the Electron Transport Layer 124, the Counter Electrode Layer 125, and the Sealing Layer 126

Figure 8D:
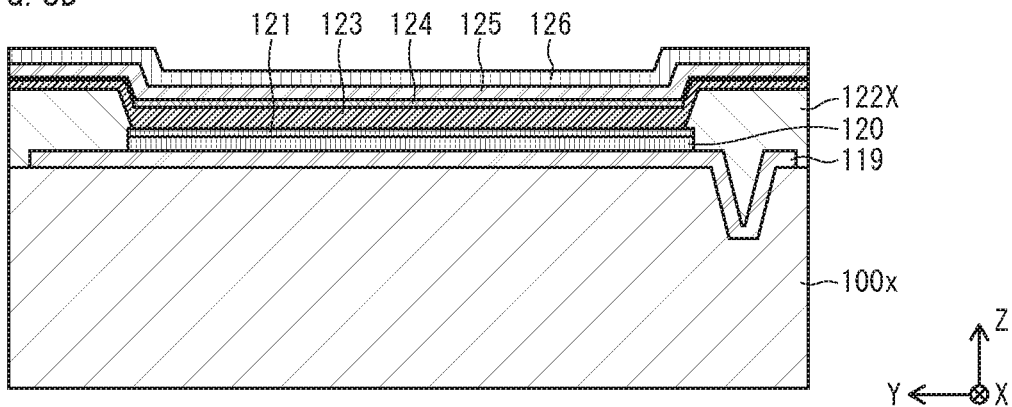

In FIG. 8D, the electron transport layer 124 is formed using vacuum deposition or the like in the gaps 522z and on the column banks 522Y as a solid film (step S70). The counter electrode layer 125 and the sealing layer 126 are layered in this order covering the electron transport layer 124 as solid films in the gaps 522z and the column banks 522Y (steps S80 and S90). The counter electrode layer 125 and the sealing layer 126 can be formed by using CVD, sputtering, or the like.

(6) Forming CF Substrate 131

Next, the CF substrate 131 is formed (step S100). FIG. 12A to FIG. 12D are schematic cross sections showing states in manufacturing the CF substrate 131 in manufacture of the organic EL display panel 10 according to at least one embodiment.

Figure 12A:
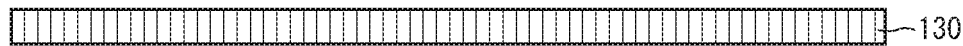
FIG. 12A to FIG. 12D are schematic cross sections showing states in manufacturing CF substrate 131 in manufacturing organic EL display panel 10 according to at least one embodiment.
Figure 12B:
Figure 12C:
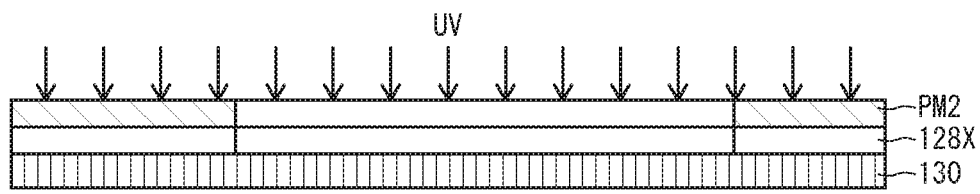
Figure 12D:
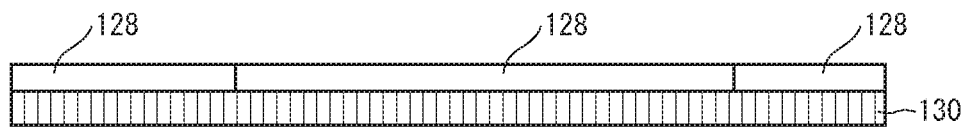

In forming the CF substrate 131, first, a light transmissive upper substrate 130 is prepared (FIG. 12A). Next, on a surface of the upper substrate 130, material of the color filter layer 128 (for example, G) that has an ultraviolet light curing resin as a primary component is dispersed in a solvent and applied as a paste 128X (FIG. 12B). After removal of a certain amount of solvent, a predefined pattern mask PM2 is placed and ultraviolet light irradiation is performed (FIG. 12C). Subsequently, curing is performed, the pattern mask PM2 and uncured paste 128X are removed and developing is performed to form the color filter layer 128(G) (FIG. 12D). The color filter layer 128(R) and 128(B) is formed by repeating the processes of FIG. 12B to FIG. 12D for color filter material of the respective color. Instead of using the paste 128X, a commercially available color filter product may be used.

(7) Joining of CF Substrate 131 and Back Panel

The following describes joining of the CF substrate 131 and the back panel (step S110).

Figure 13A:
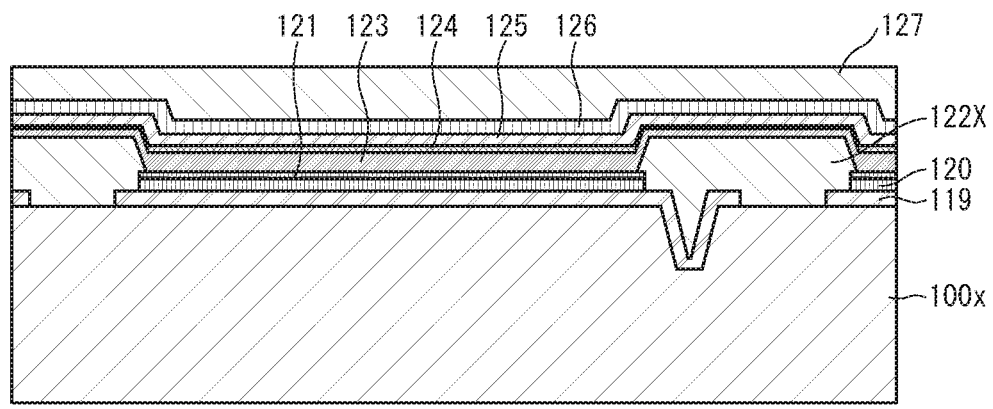
FIG. 13A to FIG. 13B are schematic cross sections taken at the same position as Y1-Y1 in FIG. 3, showing states in which CF substrate 131 and a back panel are adhered together in manufacture of organic EL display panel 10 according to at least one embodiment.

In this process, first, material of the joining layer 127, which includes ultraviolet light curing resin such as acrylic resin, silicone resin, epoxy resin, or the like, is applied to the back panel, which comprises every layer from the substrate 100x to the sealing layer 126 (FIG. 13A).

Figure 13B:
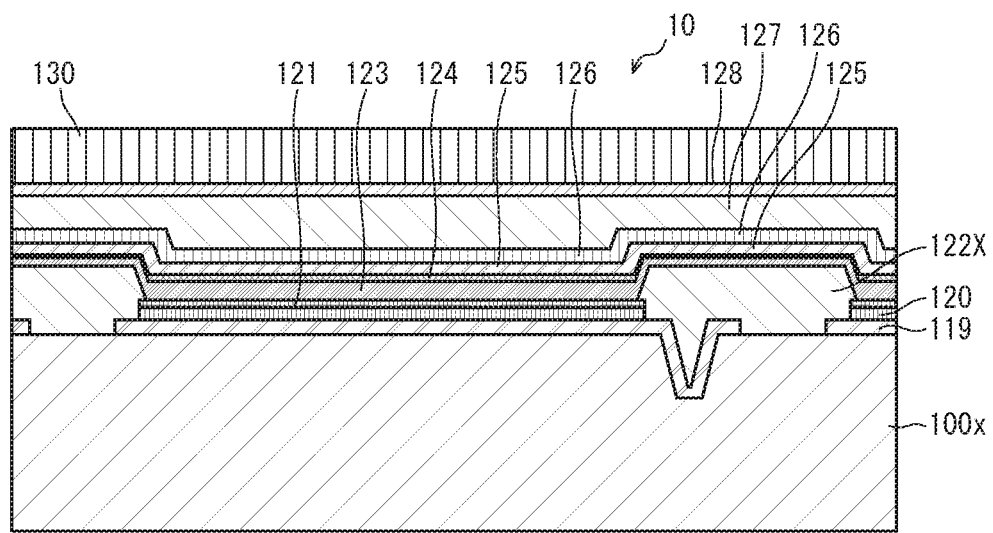

Subsequently, the applied material is irradiated with ultraviolet light, and the back panel and the CF substrate 131 are joined while matching positions relative to each other. At this time, care is taken to avoid gas entering between the back panel and the CF substrate 131. Subsequently, when the back panel and the CF substrate 131 are baked and a sealing process is complete, the display panel 10 is completed (FIG. 13B).

6. Effects of the Method of Manufacturing Display Panel 10

The following describes effects that can be obtained by the method of manufacturing the display panel 10.

6.1 Film Thickness Measurement Results

Figure 14:
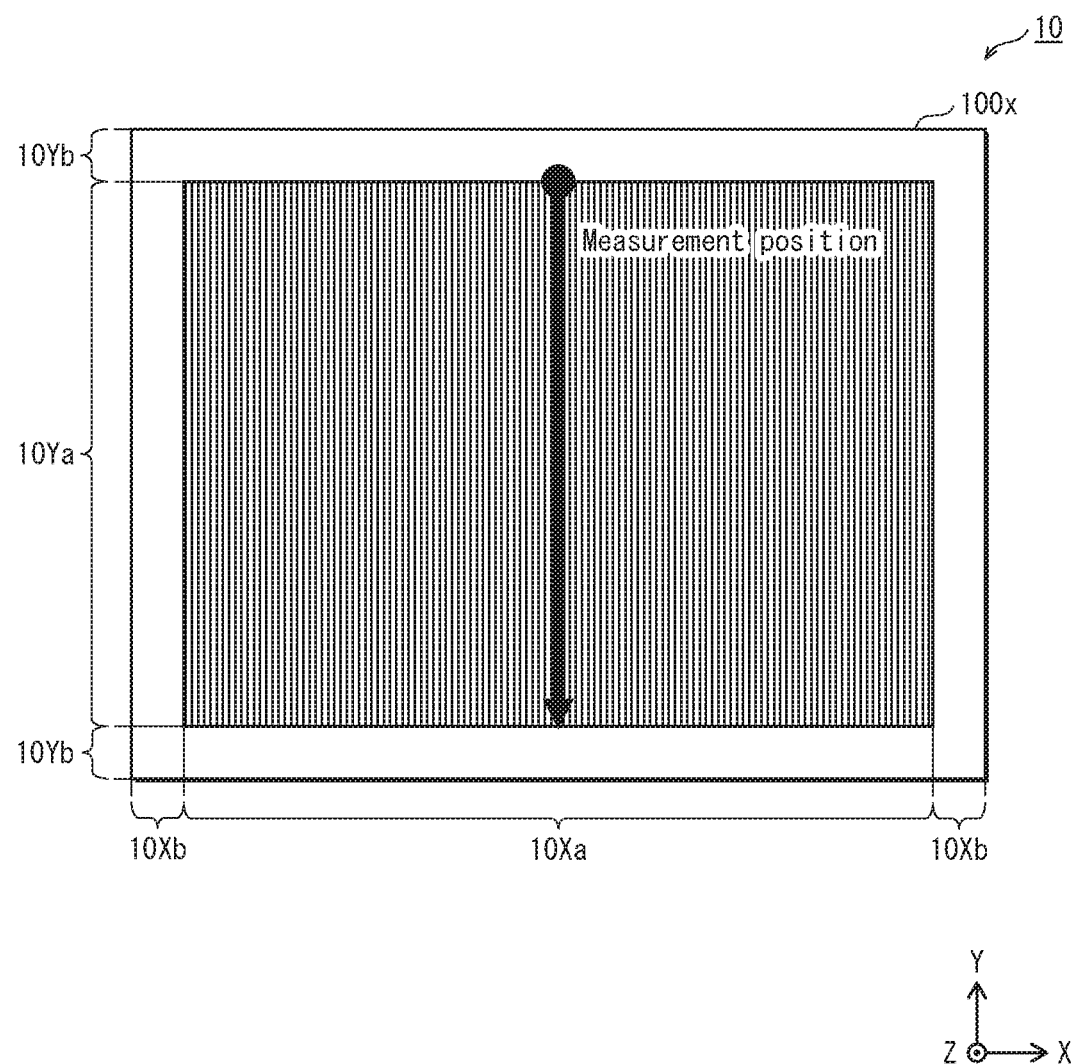
FIG. 14 is a schematic plan view showing film thickness measurement positions in working example and comparative examples 1 to 3 of organic EL display panel 10 according to at least one embodiment.

The inventors measured distribution of film thickness of the light emitting layers 123 in the display panel 10. FIG. 14 is a schematic plan view showing film thickness measurement positions for a working example of the display panel 10 and comparative examples 1 to 3 according to at least one embodiment. In the present experiment, for the working example of the display panel 10, distribution of film thickness of the light emitting layers 123 on the substrate 100x on a center line in the X direction in the partitioned region 10a was measured from a column direction end 522Ye to a column direction end 522Ye of the column banks 522Y.

(1) Samples to be Tested

The following describes specifications of the working example and the comparative examples 1 to 3.

The sample of the working example is the display panel 10 manufactured by using the ink drying device 900 in the ink drying process pertaining at least one embodiment.

Results for comparative example 1 are film thickness measurement results for a display panel manufactured by using an ink drying device that is the ink drying device 900 without the rectifying plate 400.

Figure 15:
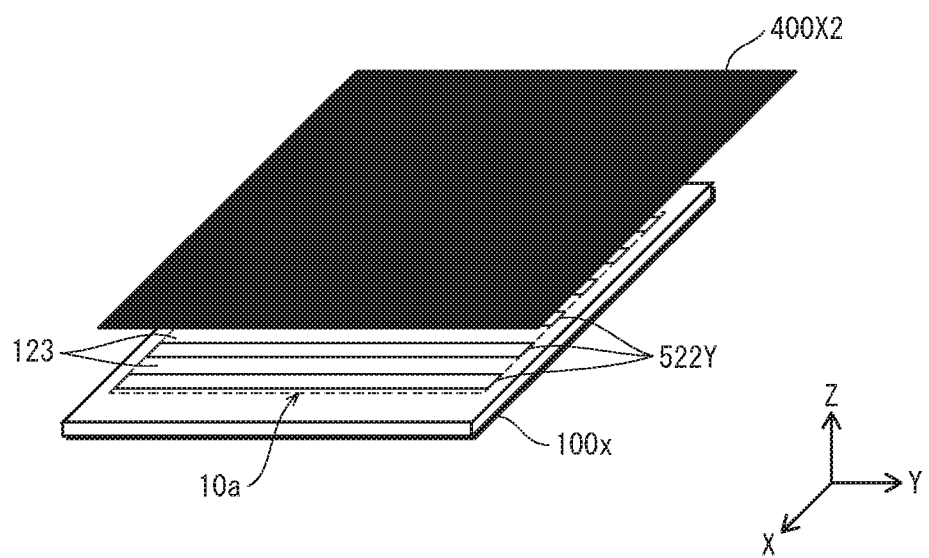
FIG. 15 is a perspective view showing positions of rectifying plate 400X2 and substrate 100x relative to each other in comparative example 2 of ink drying device according to at least one embodiment.

Results for comparative example 2 are film thickness measurement results for a display panel manufactured by using an ink drying device that is the ink drying device 900 with a rectifying plate 400X2 instead of the rectifying plate 400, the rectifying plate 400X2 not having any through holes. FIG. 15 is a perspective view showing positions of the rectifying plate 400X2 and the substrate 100x relative to each other in comparative example 2 of the ink drying device according to at least one embodiment.

Figure 16A:
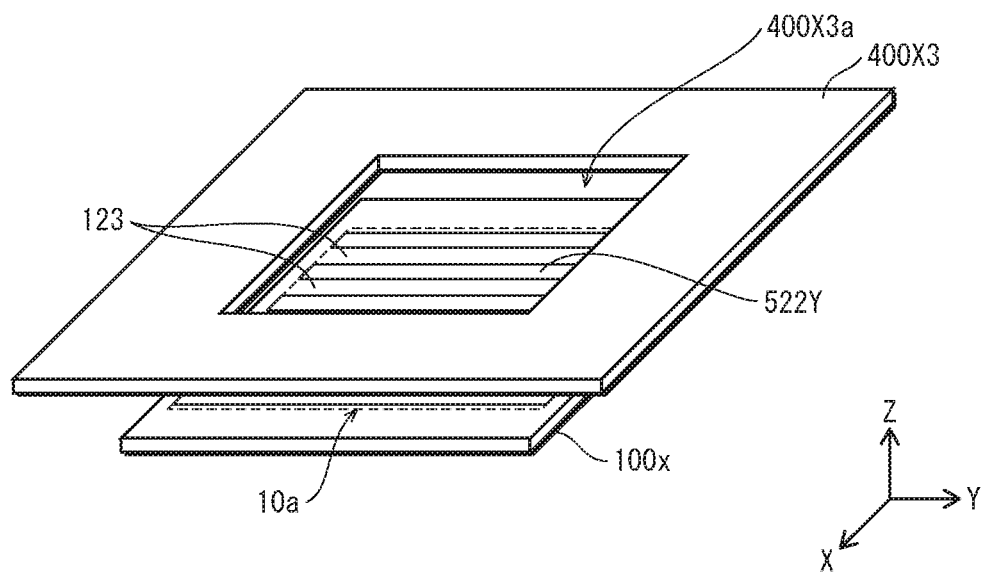
FIG. 16A is a schematic perspective view of positions of rectifying plate 400X3 and substrate 100x relative to each other in comparative example 3 of ink drying device according to at least one embodiment.
Figure 16B:
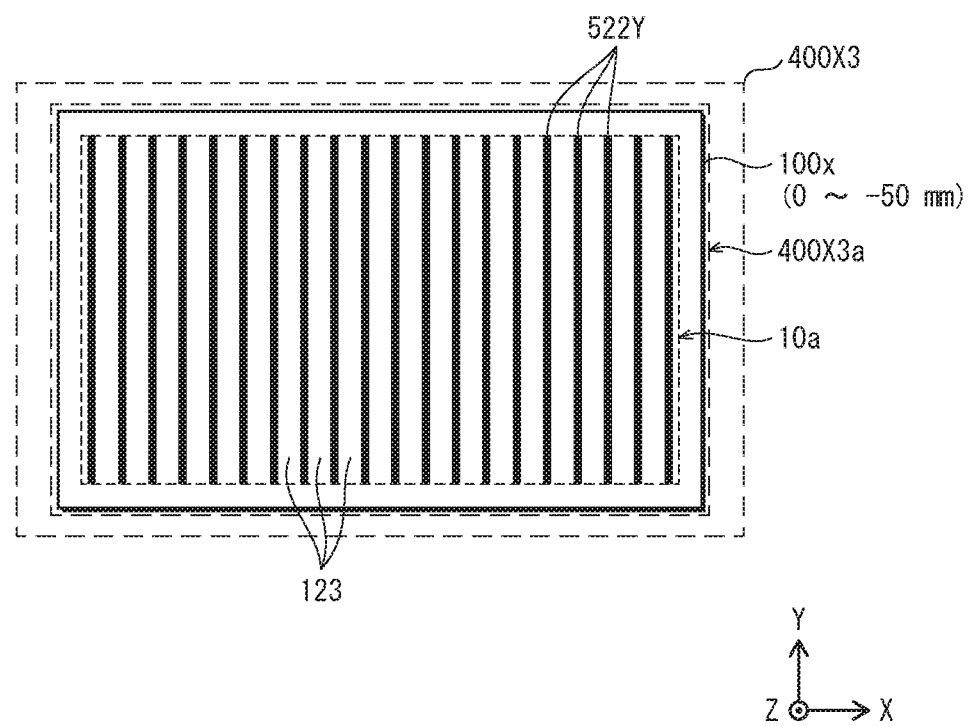
FIG. 16B is a schematic plan view of positions of rectifying plate 400X3 and substrate 100x relative to each other in comparative example 3 of ink drying device according to at least one embodiment.

Results for comparative example 3 are film thickness measurement results for a display panel manufactured by using an ink drying device that is the ink drying device 900 with a rectifying plate 400X3 instead of the rectifying plate 400, the rectifying plate 400X3 having a single opening spanning either a range opposite the partitioned region 10a of the substrate 100x or a range with an outer edge from 0 mm to 50 mm further outward in the X and Y directions than the outer edge of the range opposite the partitioned region 10a. FIG. 16A is a schematic perspective view showing positions of the rectifying plate 400X3 and the substrate 100x relative to each other in comparative example 3 of an ink drying device according to at least one embodiment. FIG. 16B is a schematic plan view of the rectifying plate 400X3 and the substrate 100X relative to each other in comparative example 3 according to at least one embodiment.

(2) Measurement Results

Figure 17:
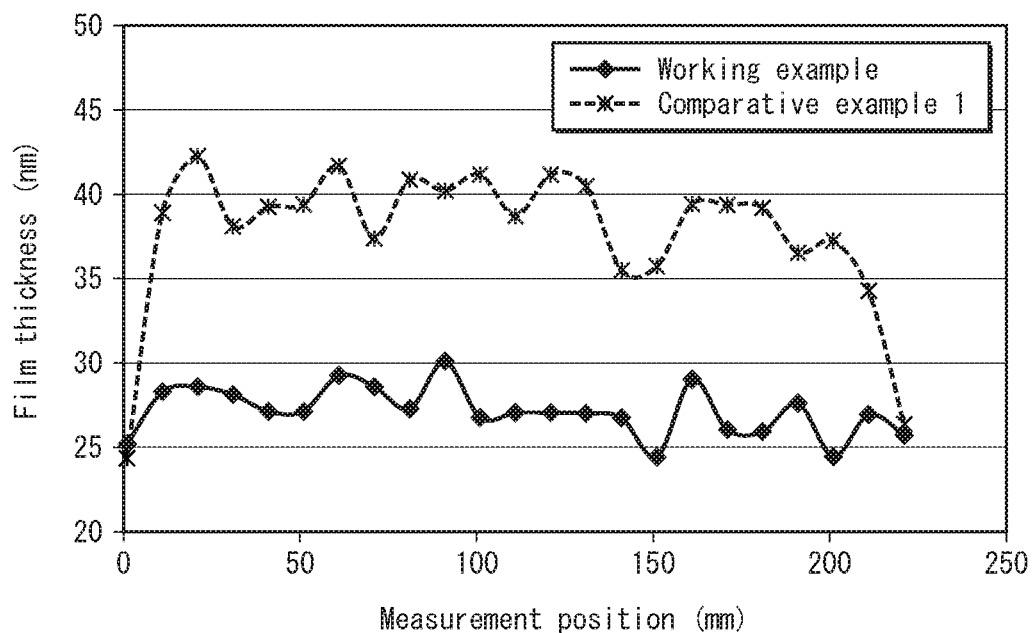
FIG. 17 is a graph of film thickness results for a working example and comparative example 1 of organic EL display panel 10 according to at least one embodiment.

FIG. 17 is a graph of measured film thickness results for the working example and comparative example 1 of the display panel 10 according to at least one embodiment. In comparative example 1, film thickness at an upstream end of the column banks 522Y (position 0 mm) is at most 18 nm less than film thickness at a position 20 mm from the upstream end of the column banks 522Y. Further, film thickness at a downstream end (position 220 mm) is at most 13 nm less than film thickness at a position 40 mm from the downstream end. In contrast, for the working example of the display panel 10, a decrease in film thickness of only about 3 nm to 5 nm was measured at both the upstream end (0 mm position) and the downstream end (220 mm position) of the column banks 522Y.

From the results above, the uniformity of film thickness of functional layers in the column shaped application region along one of the gaps 522z between two adjacent ones of the column banks 522Y is improved for the display panel 10 in comparison to the comparative example 1 for which the rectifying plate 400 is removed from the ink drying device 900.

Figure 18:
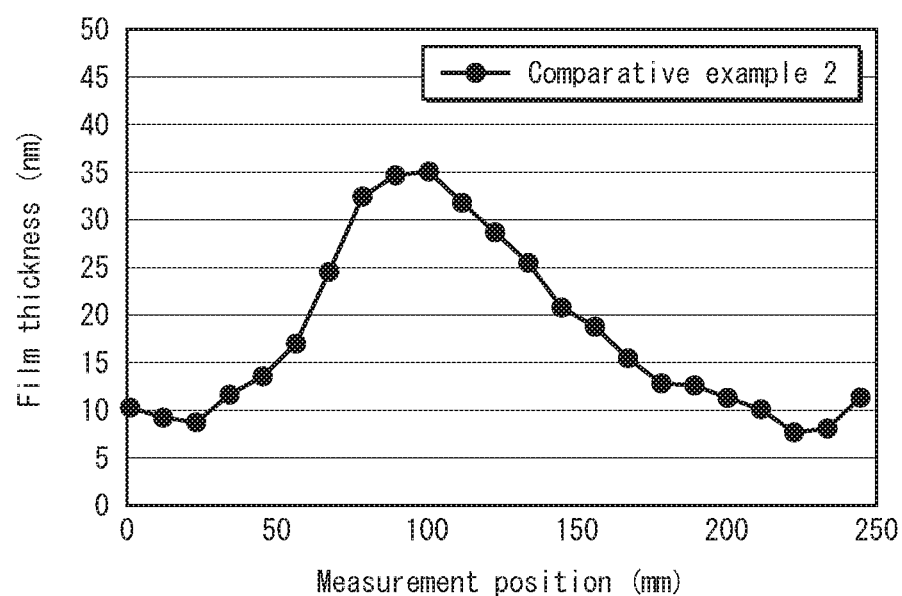
FIG. 18 is a graph of measured film thickness results for comparative example 2 of organic EL display panel 10 according to at least one embodiment.

FIG. 18 is a graph of measured film thickness results for comparative example 2 according to at least one embodiment. In comparative example 2, film thickness at an upstream end of the column banks 522Y (position 0 mm) is at most 25 nm less than film thickness at a position 100 mm from the upstream end of the column banks 522Y. Further, film thickness at a downstream end (position 220 mm) is at most 23 nm less than film thickness compared to the same position.

From the results above, the uniformity of film thickness of functional layers in the column shaped application region along one of the gaps 522z between two adjacent ones of the column banks 522Y is improved for the display panel 10 in comparison to the comparative example 2 for which the rectifying plate 400X2 is used, which has no through holes. In comparison to comparative example 1, the variation in film thickness of the functional layers in the column shaped application region along the gaps 522z is greater for comparative example 2.

Figure 19:
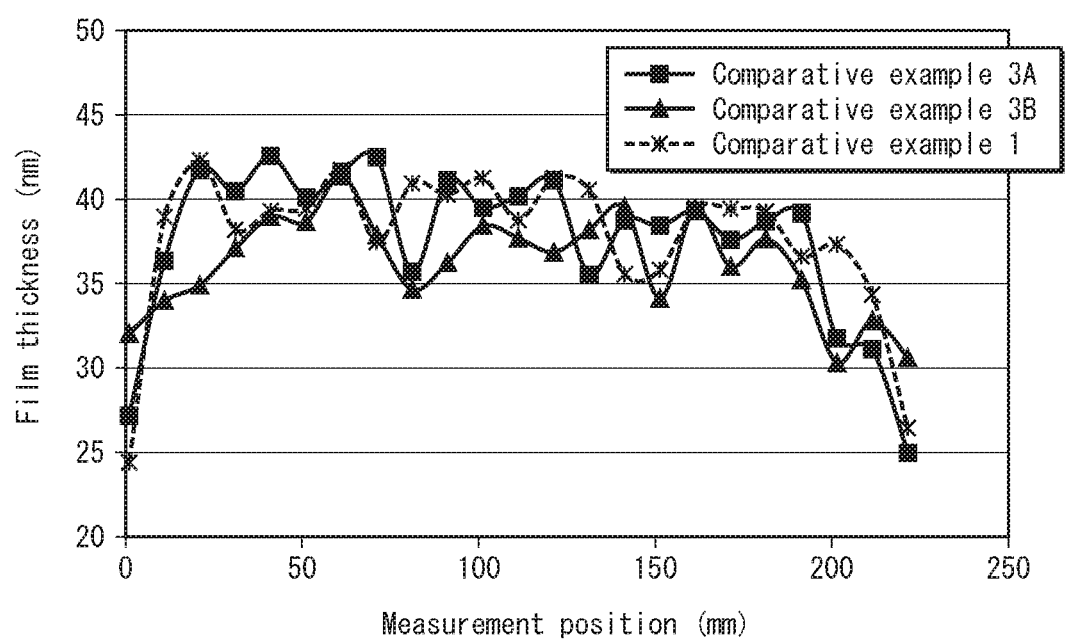
FIG. 19 is a graph of measured film thickness results for comparative example 3 according to at least one embodiment.

FIG. 19 is a graph of measurement results for film thickness for comparative example 3 and for comparative example 1 according to at least one embodiment. Comparative example 3 was tested for two different configurations, comparative example 3A and comparative example 3B. In FIG. 19, the film thickness in a display panel manufactured by using an ink drying device pertaining to comparative example 3A, which used a rectifying plate having a single opening opposing the partitioned region 10a of the substrate 100x instead of the rectifying plate 400, and in a display panel manufactured by using an ink drying device pertaining to comparative example 3B, which used a rectifying plate with an opening 20 mm larger from every edge in the X and Y directions than the partitioned region 10a.

In comparative example 3A, film thickness at an upstream end of the column banks 522Y (position 0 mm) is at most 15 nm less than film thickness at a position 20 mm from the upstream end of the column banks 522Y. Further, film thickness at a downstream end (position 220 mm) is at most 15 nm less than film thickness at a position approximately 40 mm from the downstream end, which is the same as for comparative example 1.

In comparative example 3B, film thickness at an upstream end of the column banks 522Y (position 0 mm) is at most 11 nm less than film thickness at a position 70 mm from the upstream end of the column banks 522Y. Further, film thickness at a downstream end (position 220 mm) is at most 10 nm less than film thickness at a position approximately 60 mm from the downstream end, confirming that comparative example 3A shows an improvement of about 5 nm over comparative example 1.

In comparison to the working example described above, the variation in film thickness of the functional layers in the column shaped application region along the gaps 522z is greater for both comparative example 3A and comparative example 3B.

6.2 Regarding Film Thickness Measurement Results

The following is an analysis of the film thickness measurement results for the light emitting layers 123 obtained from the display panel 10.

(1) Regarding Comparative Example 1
(Film Thickness Variation Caused by Vapor Concentration Distribution of Ink Solvent in Central and Peripheral Portions of a Substrate in Row and Column Directions of the Substrate)

With respect to a wet process of forming a functional layer by a method of applying ink to a substrate and drying the ink, the inventors studied variation in film shape due to differences in drying speed between a central portion of a display region and a peripheral portion of the display region on the substrate.

Figure 20A:
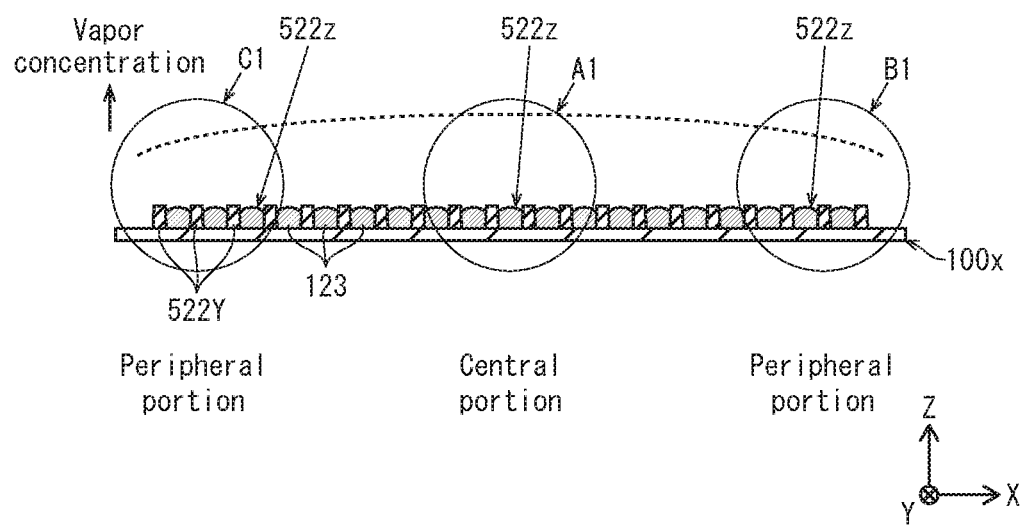
FIG. 20A and FIG. 20B are diagrams of differences in film shape between a central portion of a display region and a peripheral portion of the display region for comparative example 1 according to at least one embodiment.
Figure 20B:
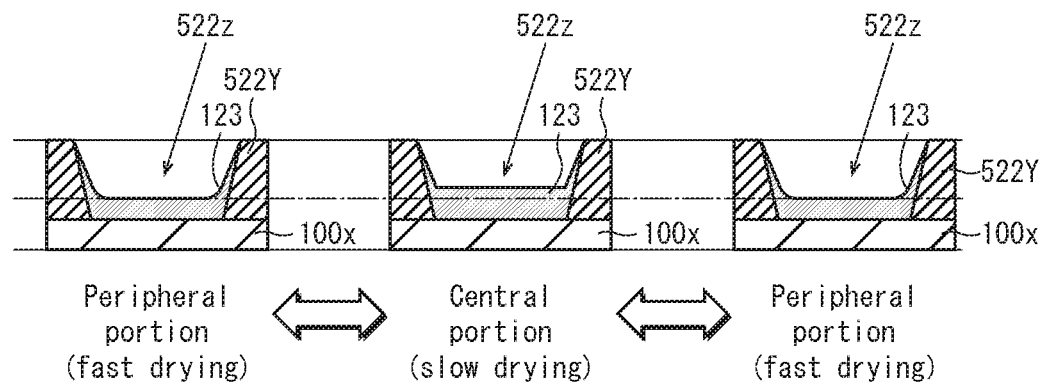

FIG. 20A and FIG. 20B are diagrams of differences in film shape between a central portion of a display region and a peripheral portion of the display region for comparative example 1 according to at least one embodiment. In FIG. 20A, 100x indicates the substrate, and 522Y indicates column banks provided on the substrate 100x, adjacent ones of the column banks 522Y defining the gaps 522z. 123 indicates ink applied to the gaps 522z for the purpose of forming light emitting layers.

In FIG. 17, when fabricating elements in which height of the column banks 522Y is uniform across a plane, comparing sub pixels of a central portion A1 of a display region for which ink solvent vapor concentration is high and drying is slow and sub pixels of a peripheral portion B1 or C1 of a display region for which ink solvent vapor concentration is relatively low and drying is fast, positioned near an edge of the partitioned region 10a, the light emitting layers 123 are thinner in the vicinity of side walls and thicker at pixel centers.

In FIG. 20A and FIG. 20B, in the central portion A1, which is slow drying, in the process of solvent evaporation, a solid component of the ink of the light emitting layers 123 sediments and moves to the bottom of the gaps 522z, increasing film thickness at the bottom portion.

Thus, in comparative example 1, film thickness variation occurs due to imbalance in solvent evaporation rate due to vapor concentration distribution of ink solvent between a central portion and a peripheral portion of the substrate in the row and column directions thereof.

(Film Thickness Variation Caused by Imbalance of Ink Surface Tension Between Central and Peripheral Portions of a Substrate in the Column Direction)

Figure 21A:
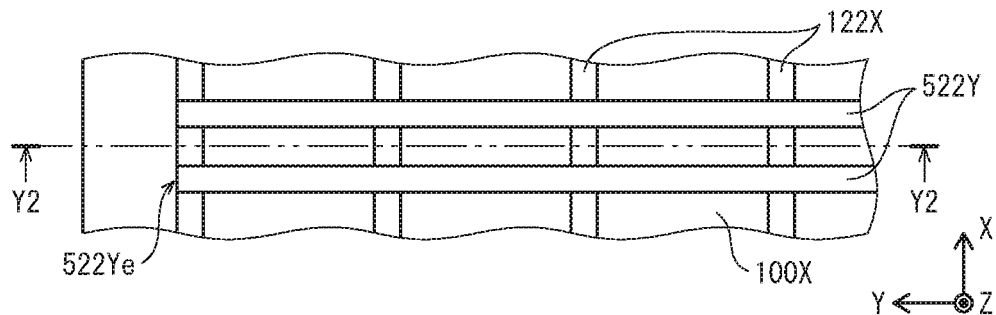
FIG. 21A is a schematic plan view around column bank end portions for comparative example 1 according to at least one embodiment.
Figure 21B:
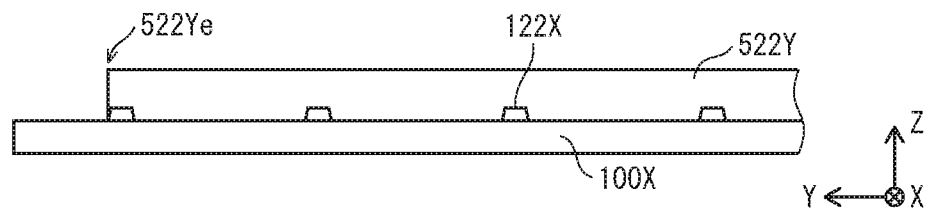
FIG. 21B is a schematic cross section taken along Y2-Y2 in FIG. 21A according to at least one embodiment.
Figure 21C:
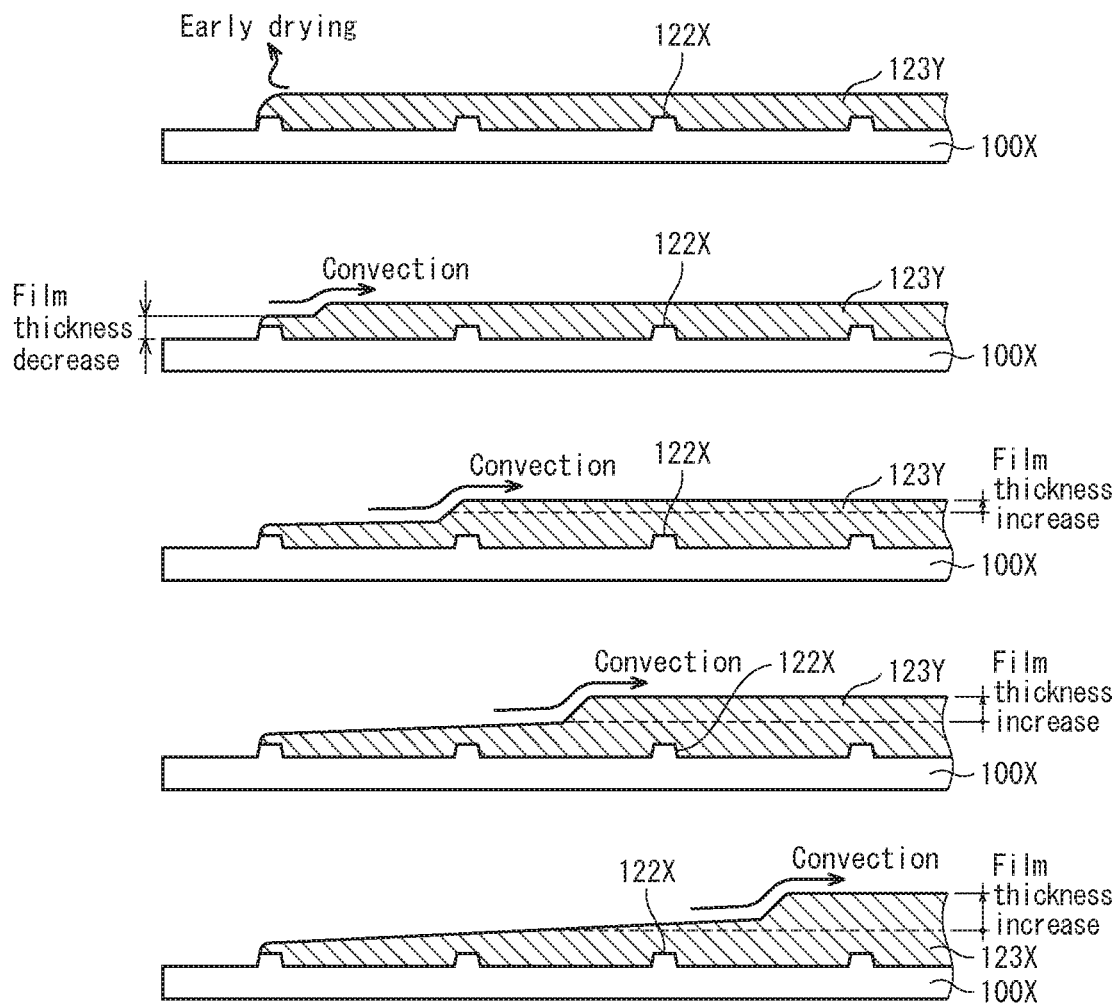
FIG. 21C shows schematic cross sections showing changes in film thickness over time according to at least one embodiment.

FIG. 21A is a schematic plan view of the substrate 100x in the vicinity of the end 522Ye of the column banks 522Y for comparative example 1 according to at least one embodiment. FIG. 21B is a schematic cross section taken along Y2-Y2 of FIG. 21A according to at least one embodiment. FIG. 21C is a schematic cross sections taken along Y2-Y2 of FIG. 21A, showing changes in film thickness of light emitting layer 123Y over time according to at least one embodiment. In FIG. 21A and FIG. 21B, the column banks 522Y and the row banks 122X are provided on the substrate 100x.

In FIG. 21C, for ink of the light emitting layer 123Y applied on the substrate 100x of the comparative example 1, drying of the solvent starts from the end 522Ye of the column banks 522Y. This is because, in a wet process, in the process of evaporating and drying the solvent of the ink, solvent vapor pressure is lower in a peripheral portion of a film forming area than in a central portion thereof, and therefore an evaporation rate of the solvent is greater. A film forming area is an area in which ink is applied by a wet process, and is the same region as the partitioned region 10a in FIG. 1. Thus, as evaporation of the solvent proceeds due to drying, evaporation of the solvent is slower for ink inwards of the ends 522Ye for which remaining solvent is greater per unit area than for ink in the vicinity of the ends 522Ye for which remaining solvent is less per unit area, causing nonuniform surface tension. Ink in the vicinity of the ends 522Ye is pulled inward by the surface tension from the ink inward of the ends 522Ye, causing ink convection directed inwards. As a result, ink in the vicinity of the ends 522Ye moves inwards, and ink film thickness inwards of the ends 522Ye increases.

Figure 22:
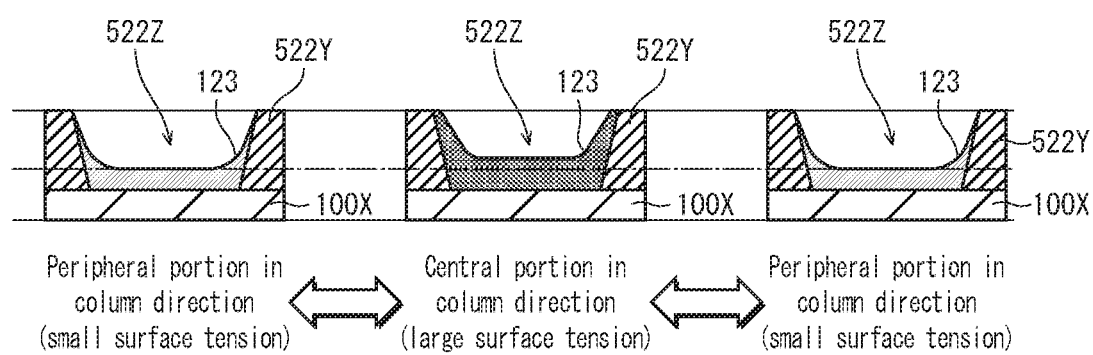
FIG. 22 is a schematic diagram of a film shape for comparative example 1 of organic EL display panel 10 according to at least one embodiment.

FIG. 21C includes upper (earlier) and lower (later) stages, and in FIG. 21C, drying of the solvent gradually progresses inwards from the ends 522Ye over time, and ink film thickness inwards of the ends 522Ye also gradually increases due to the movement of ink in this direction. Eventually, ink film thickness reaches a maximum in a central portion of the film forming area, and in FIG. 22, film shape of the light emitting layers 123Y formed also have a maximum film thickness in the central portion in the column direction of the film forming area.

Thus, in comparative example 1, film thickness variation occurs due to imbalance in ink surface tension between a central portion and a peripheral portion in the column direction.

(2) Regarding Comparative Example 2

Figure 23A:
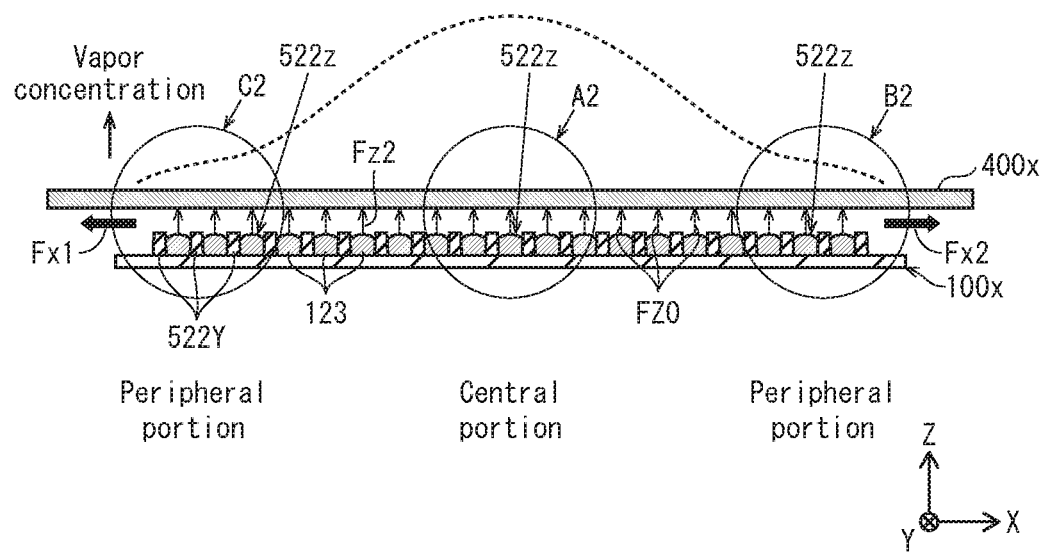
FIG. 23A and FIG. 23B are diagrams of differences in film shape between a central portion of a display region and a peripheral portion of the display region for comparative example 2 according to at least one embodiment.
Figure 23B:
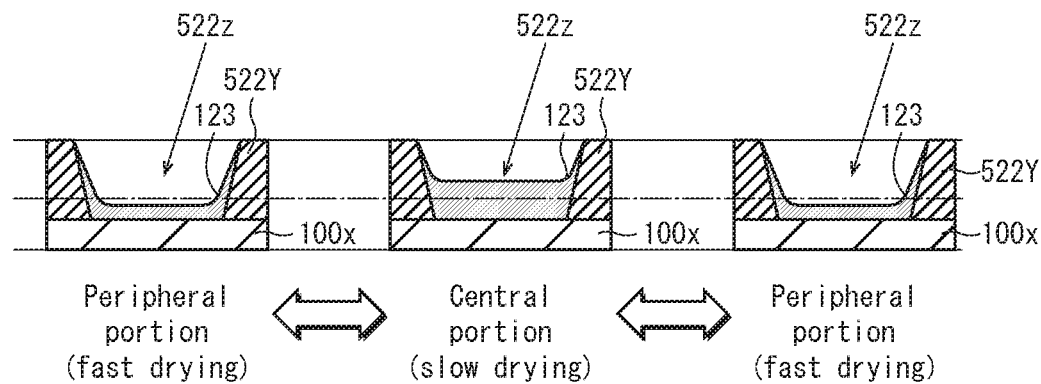

FIG. 23A and FIG. 23B are diagrams of differences in film shape between a central portion of a display region and a peripheral portion of the display region for comparative example 2 according to at least one embodiment. In FIG. 18, for comparative example 2, in which ink drying is performed by using the rectifying plate 400X2 which does not have any through holes, in comparison with comparative example 1, results were obtained showing that film thickness is even thinner in the vicinity of side walls and thicker at the center of pixels. That is, in sub pixels of a central portion A2 of the display region, in which ink solvent vapor concentration is high and drying is slow, there is a strong trend towards thinner film thickness in the vicinity of side walls and greater film thickness at the center of pixels when compared with sub pixels in peripheral portions B2 and C2 of the display region, in which ink solvent vapor concentration is relatively low and drying is fast in the outer periphery of the partitioned region 10a.

In FIG. 23A and FIG. 23B, by using the rectifying plate 400X2, which does not have any through holes, ink solvent vapor is not exhausted upwards (Fz2) from a gap between the rectifying plate 400X2 and the substrate 100x, but only from an outer peripheral edge of the gap (Fx1, Fx2), further increasing the difference in vapor concentration between the central portion A2 and the peripheral portions B2 and C2. Thus, for the central portion A2, in which drying is even more limited than in comparative example 1, in the process of solvent evaporation, a solid component of the ink of the light emitting layers 123 sediments and moves to the bottom of the gaps 522z, increasing film thickness at the bottom portion.

Thus, in comparative example 2, film thickness variation is greater than in comparative example 1 due to imbalance in solvent evaporation rate due to vapor concentration distribution of ink solvent between a central portion and a peripheral portion of the substrate in the row and column directions thereof.

On the other hand, film thickness variation occurring due to imbalance in ink surface tension between a central portion and a peripheral portion in the column direction is the same for comparative example 2 and comparative example 1.

(3) Regarding Working Example

Figure 24A:
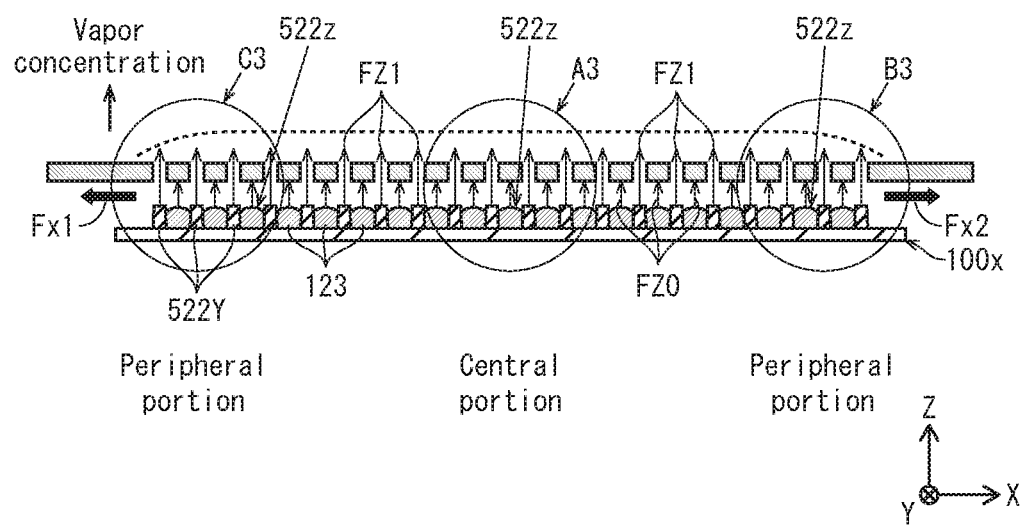
FIG. 24A and FIG. 24B are diagrams of differences in film shape between a central portion of a display region and a peripheral portion of the display region for a working example according to at least one embodiment.
Figure 24B:
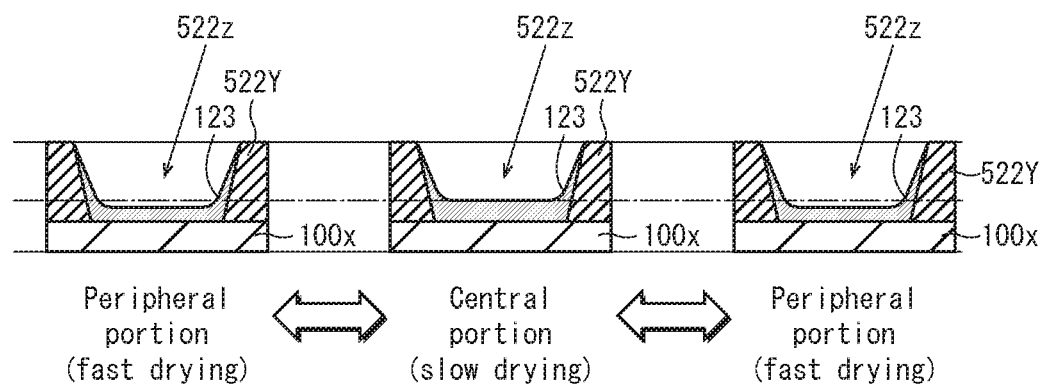

FIG. 24A and FIG. 24B are diagrams of differences in film shape between a central portion of a display region and a peripheral portion of the display region for a working example according to at least one embodiment. For the working example, for which ink drying is performed by using the rectifying plate 400 in which the through holes 400a have a uniform density, the results show a decrease, relative to comparative examples 1 and 2, in difference of film thickness of the light emitting layers 123 between sub pixels of a central portion A3 of a display region and sub pixels of peripheral portions B3 and C3 of the display region in the vicinity of the outer periphery of the partitioned region 10a, in FIG. 17.

In FIG. 24A and FIG. 24B, by using the rectifying plate 400 having a uniform density of the through holes 400a, ink solvent vapor is mainly exhausted from the gap between the rectifying plate 400 and the substrate 100x upward through the through holes 400a (Fz1); movement of vapor across the plane of the substrate 100x to be exhausted from an outer peripheral edge (Fx1, Fx2) decreases, and therefore a difference in vapor concentration between the central portion A3 and the peripheral portions B3 and C3 is decreased and a difference in solvent evaporation rate between the central portion A3 and the peripheral portions B3 and C3 is decreased. Thus, in the central portion A3, in comparison with the peripheral portions B3 and C3, in the process of solvent evaporating, the tendency for the solid component of ink of the light emitting layers 123 to sediment and move to the bottom of the gaps 522z, and for film thickness at the bottom to increase, can be suppressed.

Thus, in the working example, film thickness variation caused by imbalance in solvent evaporation rate due to vapor concentration distribution of ink solvent between a central portion and a peripheral portion of the substrate in the row and column directions thereof is less than for comparative examples 1 and 2.

Film thickness variation occurring due to imbalance in ink surface tension between a central portion and a peripheral portion in the column direction is improved for the working example, in comparison with comparative examples 1 and 2. In the working example, film thickness variation caused by ink solvent vapor concentration distribution between the central portion and peripheral portion of the substrate is decreased, and therefore evaporation rate difference that is a cause of imbalance in ink surface tension in the column shaped application region is decreased, as is imbalance in ink surface tension.

Thus, according to the working example, in FIG. 24B, film shape of light emitting layers 123 formed have equivalent film thickness in the peripheral portion and central portion of the film forming area. That is, film thickness variation caused by imbalance of solvent evaporation rate due to ink solvent vapor concentration distribution between the central portion and peripheral portion of the substrate is suppressed, and the influence of ink convection caused by imbalance of ink surface tension in the column shaped application region when applying ink containing organic light emitting material in the column shaped application region on the substrate is alleviated. As a result, luminance unevenness caused by nonuniformity of film thickness of the light emitting layers 123 in peripheral and central portions of the film forming area is reduced.

7. Partial Summary

As described above, according to at least one embodiment of the method of manufacturing the display panel 10 pertaining to the embodiment, in which pixels are arranged in a matrix of rows and columns on the substrate 100x. The method includes preparing the substrate 100x. The method further includes forming pixel electrode layers in the matrix on the substrate 100x. The method further includes arranging the column banks 522Y, which extend in a column direction, above the substrate 100x along a row direction and disposed at least between edges of the pixel electrode layers in the row direction. The method further includes applying ink containing organic light emitting material to the gaps 522z between adjacent ones of the column banks 522Y so that the ink is continuous between ends of the adjacent ones of the column banks 522Y in the column direction. The method further includes arranging the substrate 100x with the ink applied and the rectifying plate 400 facing each other, the rectifying plate 400 having a uniform density of the through holes 400a, such that the rectifying plate 400 is at a predefined distance from the column banks 522Y and the through holes 400a are disposed in at least a range facing the column banks 522Y in plan view of the substrate 100x. The method further includes exhausting gas from an environment including the substrate 100x and the rectifying plate 400. The method further includes drying the ink by heating the substrate 100x, to form an organic functional layer. The method further includes forming the counter electrode layer above the organic functional layer after removing the rectifying plate 400.

According to the method of manufacturing the display panel 10 including the ink drying process, film shape and film thickness of the light emitting layers 123 formed become substantially equivalent in both peripheral portions and central portions of the film forming area.

As described above, diameter and pitch of the through holes 400a realizes a uniform arrangement at least in a region opposing the partitioned region 10a of the substrate 100x. Thus, the ink solvent vapor evaporated from the partitioned region 10a is, in the partitioned region 10a, exhausted above the rectifying plate 400 via the through holes 400a at a uniform speed.

Thus, film thickness variation caused by imbalance of solvent evaporation speed due to ink solvent vapor concentration distribution in central and peripheral portions of the substrate 100x is suppressed, and the influence of ink convection caused by imbalance of ink surface tension in column shaped application regions when manufacturing by applying ink containing organic light emitting material to the column shaped application regions on the substrate 100x is alleviated. As a result, film thickness of the light emitting layers 123 can be made more uniform both in the column shaped application regions 522z and between the column shaped application regions 522z on the substrate 100x. That is, luminance unevenness across the display 10 caused by nonuniformity of film thickness of light emitting layers 123 in the peripheral portion and the central portion of the film forming area of the display panel 10 can be reduced.

Further, during the drying of the ink, while the substrate 100x and the rectifying plate 400 are facing each other, a ratio of a minimum gap between the rectifying plate 400 and the column banks 522Y and opening length of the through holes 400a may be from 0.5 to 2.

According to this configuration, in the space between the substrate 100x and the rectifying plate 400, ink solvent vapor evaporated from the partitioned region 10a of the substrate 100x is suppressed from moving across the substrate 100x and the ink solvent vapor evaporated from the partitioned region 10a is exhausted above the rectifying plate 400 via the through holes 400a at a uniform speed in the partitioned region 10a.

Further, a ratio of open area of the rectifying plate 400 in a range of the rectifying plate 400 facing the column banks 522Y may be from 20% to 40%.

According to this configuration, in the space between the substrate 100x and the rectifying plate 400, ink solvent vapor evaporated from the partitioned region 10a of the substrate 100x is suppressed from moving across the substrate 100x and the ink solvent vapor evaporated from the partitioned region 10a is exhausted above the rectifying plate 400 via the through holes 400a at a uniform speed in the partitioned region 10a.

The ink drying device 900 used in the method of manufacturing the display panel 10 pertaining to at least one embodiment is an ink drying device used for drying ink that is applied to gaps between adjacent ones of column banks disposed on a substrate so that the ink is continuous between ends of the adjacent ones of the column banks in a column direction thereof. The ink drying device 900 includes the chamber in which the substrate 100x with the ink applied is installed; the support base in the chamber on which the substrate 100x is placed. The ink drying device 900 further includes the rectifying plate 400 provided with a uniform density of through holes. The ink drying device 900 further includes a support unit that causes the rectifying plate 400 to face the support base such that the rectifying plate 400 is at a predefined distance from the column banks and the through holes are disposed in at least a range facing the column banks in plan view of the substrate 100x. The ink drying device 900 further includes a unit that exhausts gas from the chamber and a unit that heats the substrate.

In an ink drying process using the ink drying device 900, film shape of the light emitting layers 123 to be formed become equivalent in both a peripheral portion and a central portion of a film forming area. That is, film thickness variation caused by imbalance of solvent evaporation rate due to vapor concentration distribution of ink solvent in the central portion and the peripheral portion of the substrate 100x is suppressed. As a result, in a display panel manufactured by application of ink containing organic light emitting material to column shaped application regions on a substrate, improvement can be made to luminance unevenness caused by nonuniformity of film thickness of the light emitting layers 123 in peripheral and central portions of the film forming area of the display panel 10.

The following is a description of a method of manufacturing a display panel 10A by using an ink drying device 900A according to at least one embodiment.

According to the method of manufacturing the display panel 10 by using the ink drying device 900 pertaining to at least one embodiment, in the ink drying process, the rectifying plate 400, which has the through holes 400a with uniform density, is arranged at a predefined distance from the column banks, facing the substrate with the ink applied. However, shape of the rectifying plate is not limited to the example above, and may be appropriately changed.

Figure 25:
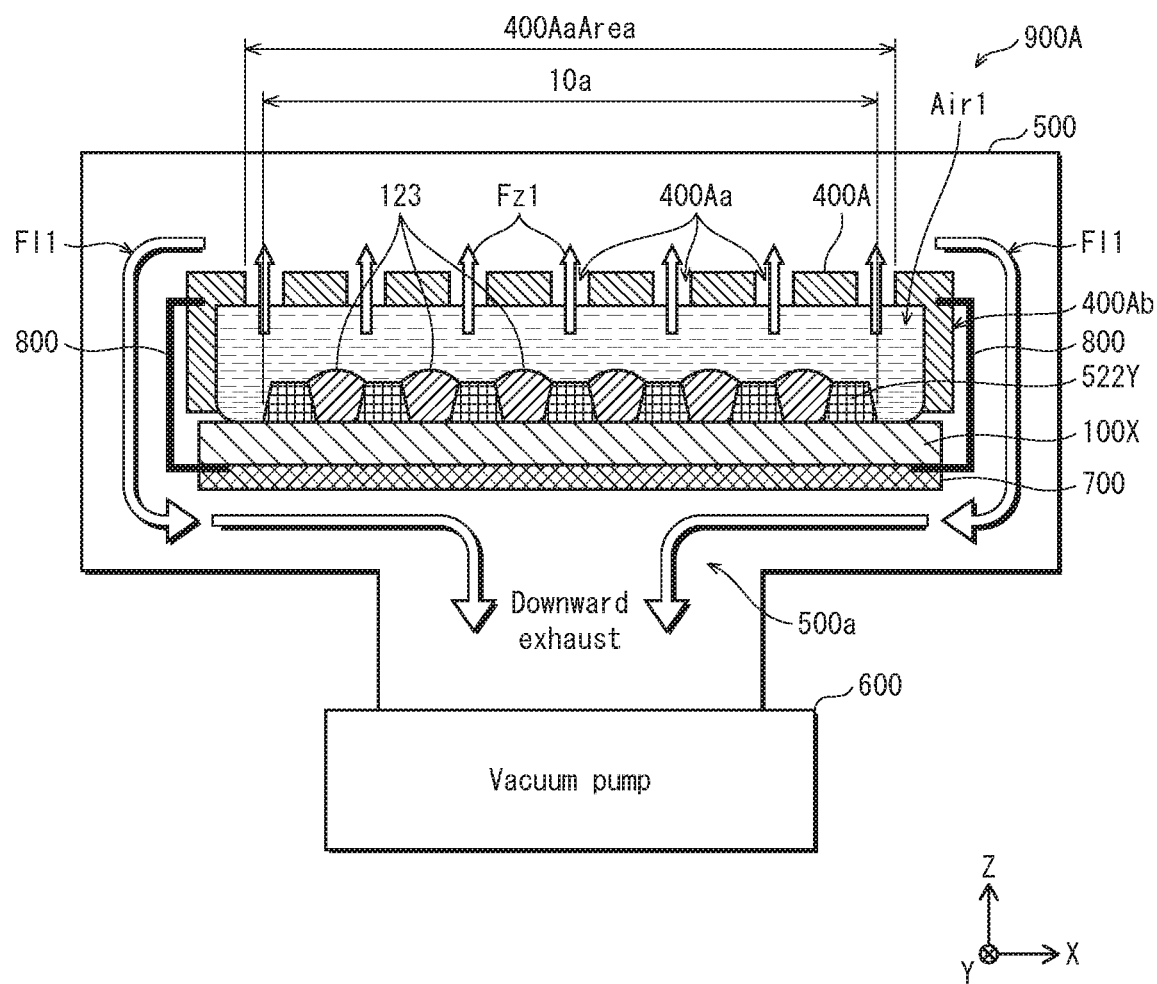
FIG. 25 is a schematic cross section of ink drying device 900A usable in a method of manufacturing organic EL display panel 10 according to at least one embodiment.
Figure 26A:
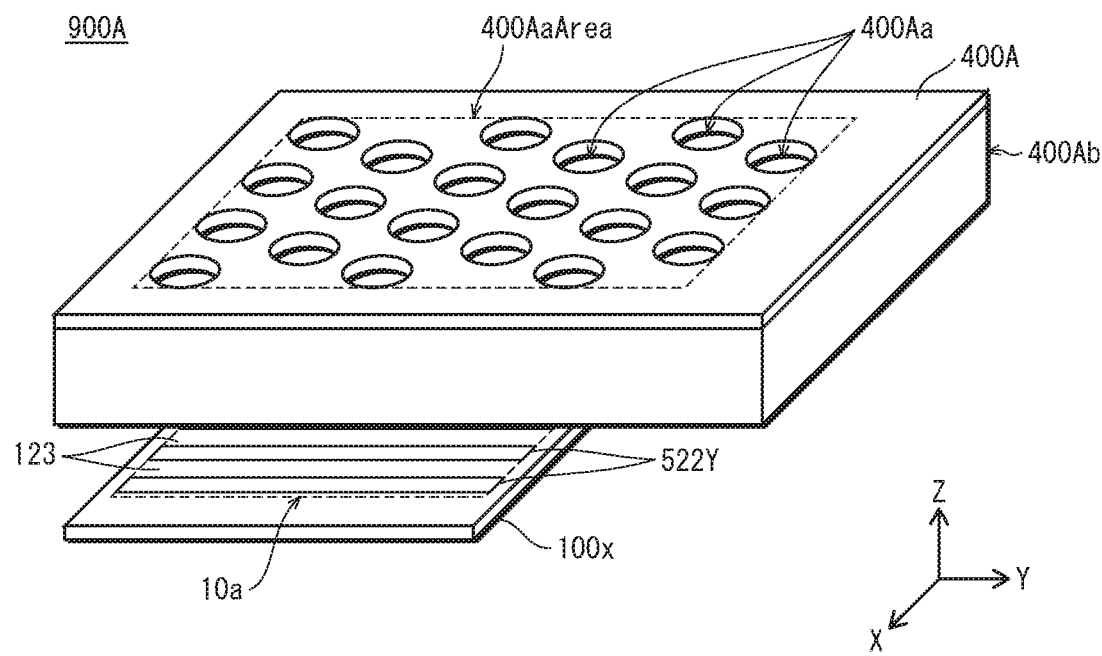
FIG. 26A is a schematic perspective view showing positions of rectifying plate 400A and substrate 100x relative to each other in ink drying device 900A according to at least one embodiment.
Figure 26B:
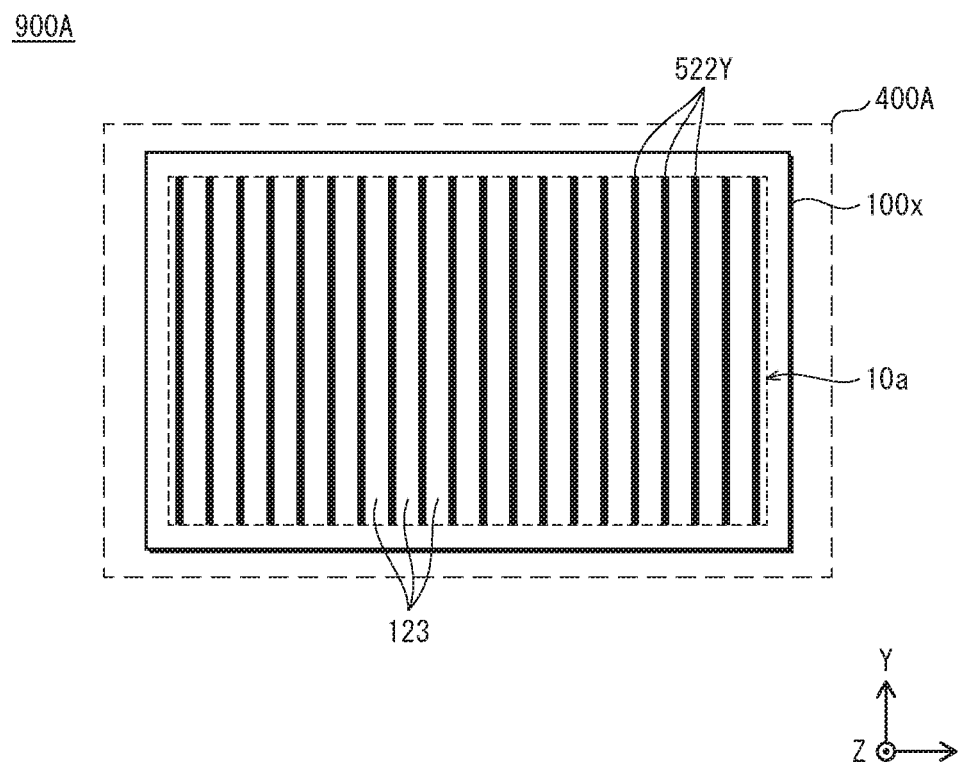
FIG. 26B is a schematic plan view of substrate 100x shown through a transparent rectifying plate 400A according to at least one embodiment.

FIG. 25 is a schematic cross section of the ink drying device 900A used in a method of manufacturing the organic EL display panel 10 pertaining to Modification 1 according to at least one embodiment. FIG. 26A is a schematic perspective view showing positions of a rectifying plate 400A and the substrate 100x relative to each other in the ink drying device 900A according to at least one embodiment. FIG. 26B is a schematic plan view of the substrate 100x shown through a transparent rectifying plate 400A according to at least one embodiment.

In FIG. 25, FIG. 26A, and FIG. 26B, the ink drying device 900A is configured to have the rectifying plate 400A with through holes 400Aa of uniform density and a peripheral wall 400Ab surrounding a region of a surface facing the column banks 522Y. In the ink drying process, in a state in which the rectifying plate 400A is spaced apart from the column banks 522Y by a predefined distance, facing the substrate 100x with the ink applied, when viewing the substrate 100x in plan view, the peripheral wall 400Ab surround the column banks 522Y. Elements of the rectifying plate 400A other than the peripheral wall 400Ab, and components of the ink drying device 900A other than the rectifying plate 400A, are the same as those of the ink drying device 900, and description thereof is not repeated here.

According to this configuration, exhausting ink solvent vapor from the gap between the rectifying plate 400A and the substrate 100x to the outer periphery (Fx0) can be stopped, and all ink solvent vapor is exhausted upwards (Fz1) through the through holes 400a of the rectifying plate 400A. Thus, difference in vapor concentration between a central portion A4 and peripheral portions B4 and C4 can be further decreased.

Figure 27A:
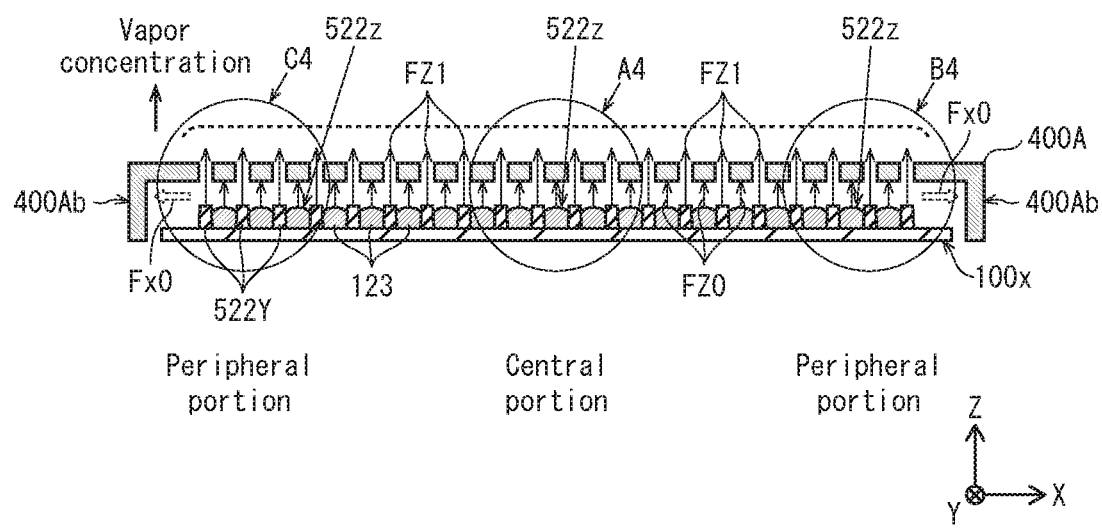
FIG. 27A and FIG. 27B are diagrams of differences in film shape between a central portion of a display region and a peripheral portion of the display region for a working example according to at least one embodiment.
Figure 27B:
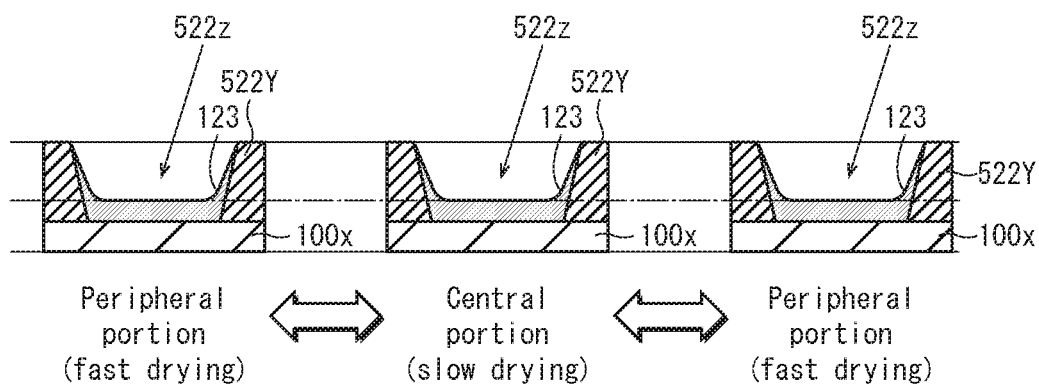

FIG. 27A and FIG. 27B are diagrams of differences in film shape between a central portion of a display region and a peripheral portion of the display region according to at least one embodiment. According to the modification in which the ink drying is performed by using the rectifying plate 400A provided with the through holes 400a in uniform density and the outer wall Ab around a periphery, difference in film thickness of the light emitting layers 123 of sub pixels of the central portion A4 of a display region and sub pixels of the peripheral portions B4 and C4 of the display region in the vicinity of the outer periphery of the partitioned region 10a is considered to be equivalent to or smaller than that of the working example.

In FIG. 27A and FIG. 27B, by using the rectifying plate 400A provided with the peripheral wall 400Ab, ink solvent vapor is all exhausted from the gap between the rectifying plate 400A and the substrate 100x via the through holes 400Aa (Fz1), stopping vapor exhaustion from the peripheral edge (Fx0) and further reducing difference in vapor concentration between the central portion A4 and the peripheral portions B4 and C4. Thus, an increase in film thickness of a bottom portion of ink of the light emitting layers 123 is substantially eliminated in the central portion A4. In at least one embodiment, the rectifying plate 400A is used with the peripheral wall 400Ab in a case in which the gap between the rectifying plate 400A and the column banks 522Y on the substrate 100x is 20 mm or more when arranged facing the substrate 100x. This is because when the gap is 20 mm or greater, movement of evaporated ink solvent vapor across the plane of the substrate 100x occurs. Further, in a case of length of the rectifying plate 400 in the X and Y directions being similar to length of the substrate in the X and Y directions, use of the rectifying plate 400A with the peripheral wall 400Ab is preferred. This is because movement of ink solvent vapor across the plane of the substrate 100x also occurs in this case.

Note that, in at least one embodiment, the peripheral wall 400Ab of the rectifying plate 400A is not brought into contact with the surface of the substrate 100x.

As described above, according to at least one embodiment, the rectifying plate 400A has the peripheral wall 400Ab surrounding a region on the surface of the rectifying plate 400A facing the column banks 522Y, and in the process of drying the ink, the peripheral wall 400Ab surrounds the column banks 522Y in plan view of the substrate 100x. According to this configuration film thickness variation caused by imbalance in solvent evaporation rate due to vapor concentration distribution of ink solvent between a central portion and a peripheral portion of the substrate in the row and column directions thereof is substantially eliminated relative to that of comparative examples 1 and 2.

Film thickness variation occurring due to imbalance in ink surface tension between a central portion and a peripheral portion in the column direction is improved in comparison with the working example. In at least one embodiment, film thickness variation caused by ink solvent vapor concentration distribution between the central portion and peripheral portion of the substrate is decreased, and therefore imbalance in ink surface tension in the column shaped application region is further decreased.

As a result, luminance unevenness caused by nonuniformity of film thickness of the light emitting layers 123 in peripheral and central portions of the film forming area is further reduced.

The following describes a method of manufacturing a display panel by using an ink drying device 900B according to at least one embodiment.

9.1 Configuration of Ink Drying Device 900B

According to the method of manufacturing the display panel 10 by using the ink drying device 900 pertaining to at least one embodiment, in the ink drying process, the rectifying plate 400, which has the through holes 400a with uniform density, is arranged at a predefined distance from the column banks, facing the substrate with the ink applied. However, the through holes 400a of the rectifying plate are not limited to the example above, and may be appropriately changed.

Figure 28A:
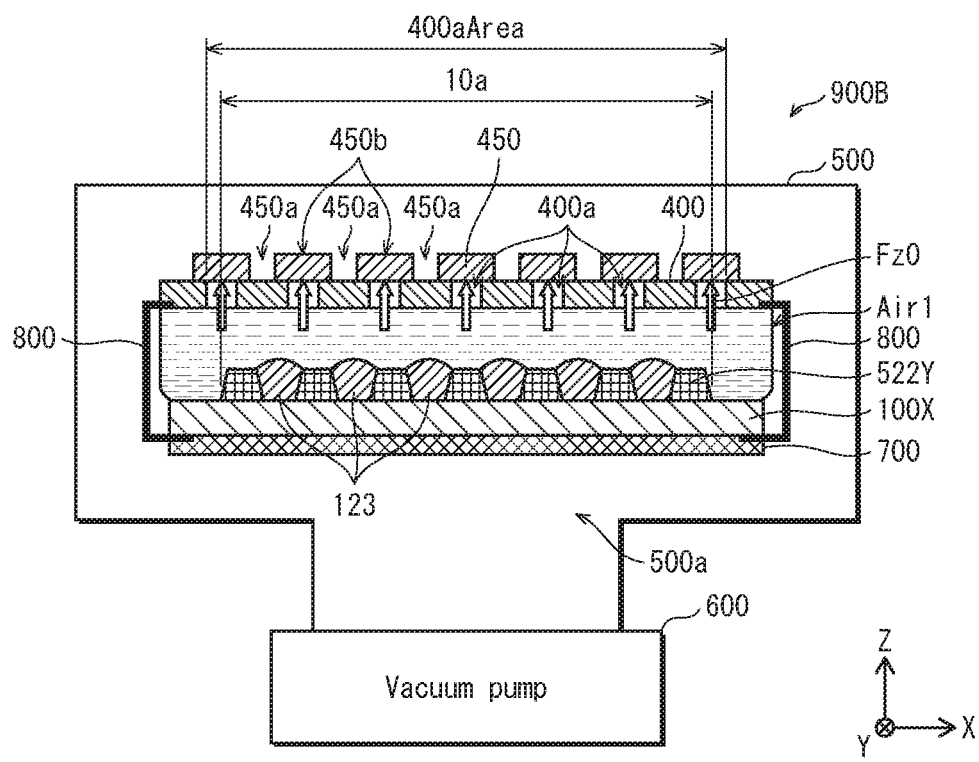
FIG. 28A and FIG. 28B are schematic cross sections of ink drying device 900B usable in a method of manufacturing organic EL display panel 10 pertaining to according to at least one embodiment.
Figure 28B:
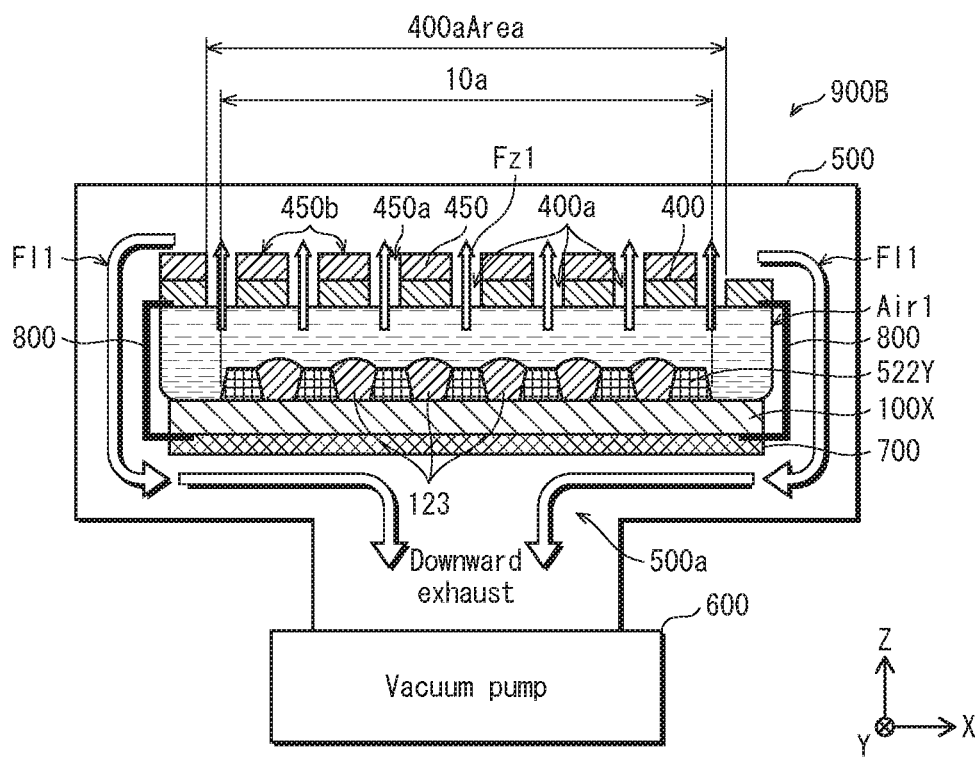

FIG. 28A and FIG. 28B are schematic cross sections of the ink drying device 900B used in a method of manufacturing the organic EL display panel pertaining to Modification 2 according to at least one embodiment. In FIG. 28A and FIG. 28B, the ink drying device 900B has the rectifying plate 400 with uniform density of the through holes 400a, as in the ink drying device 900 pertaining to the embodiment. The ink drying device 900B differs from the ink drying device 900 in that all or part of the through holes 400a in the rectifying plate 400 are provided with a covering mechanism 450 that can open and close. Here, closing all the through holes 400a means closing the through holes 400a by completely covering each of the through holes 400a. Meanwhile, closing part of the through holes 400a includes both a case in which the through holes 400a are partially covered to reduce the opening ratio of each through hole and a case in which a portion of the through holes 400a is covered, decreasing a ratio of open through holes. Elements other than the covering mechanism 450 of the ink drying device 900B are the same as those of the ink drying device 900, and description thereof is not repeated here.

FIG. 28A includes a state in which the covering mechanism 450 has closed all of the through holes 400a. A lid portion 450b of the covering mechanism 450 is located above the through holes 400a of the rectifying plate 400 and covers the openings of the through holes 400a. In this state, ink solvent vapor is blocked by the lid portion 450b of the covering mechanism 450 and is not exhausted upwards through the through holes 400a of the rectifying plate 400 (FIG. 28A, Fz0).

FIG. 28B includes a state in which the covering mechanism 450 leaves all of the through holes 400a open. Open portions 450a of the covering mechanism 450 are positioned above the through holes 400a of the rectifying plate 400 and the lid portion 450b is moved to a position that does not overlap with the through holes 400a, uncovering the through holes 400a. In this state, ink solvent vapor is exhausted upwards via the through holes 400a of the rectifying plate 400 (FIG. 28B, Fz1).

As described above, according to the ink drying device 900B, the rectifying plate 400 provided with the covering mechanism 450 that can open and close all or part of the through holes 400a of the rectifying plate 400, in the ink drying process, while the rectifying plate 400 is facing the substrate 100x with ink applied at a predefined distance from the column banks 522Y, is disposed above the column banks 522Y with the through holes 400a positioned above the column banks 522Y in plan view of the substrate 100x.

According to this configuration, for a predefined time while all or part of the through holes 400a are closed, maintaining a high vapor concentration of ink solvent vapor Air1 in the environment between the rectifying plate 400A and the substrate 100x and suppressing ink solvent evaporation from the partitioned region 10a of the substrate 100x are possible.

9.2 Ink Drying Method Using Ink Drying Device 900B

Figure 29:
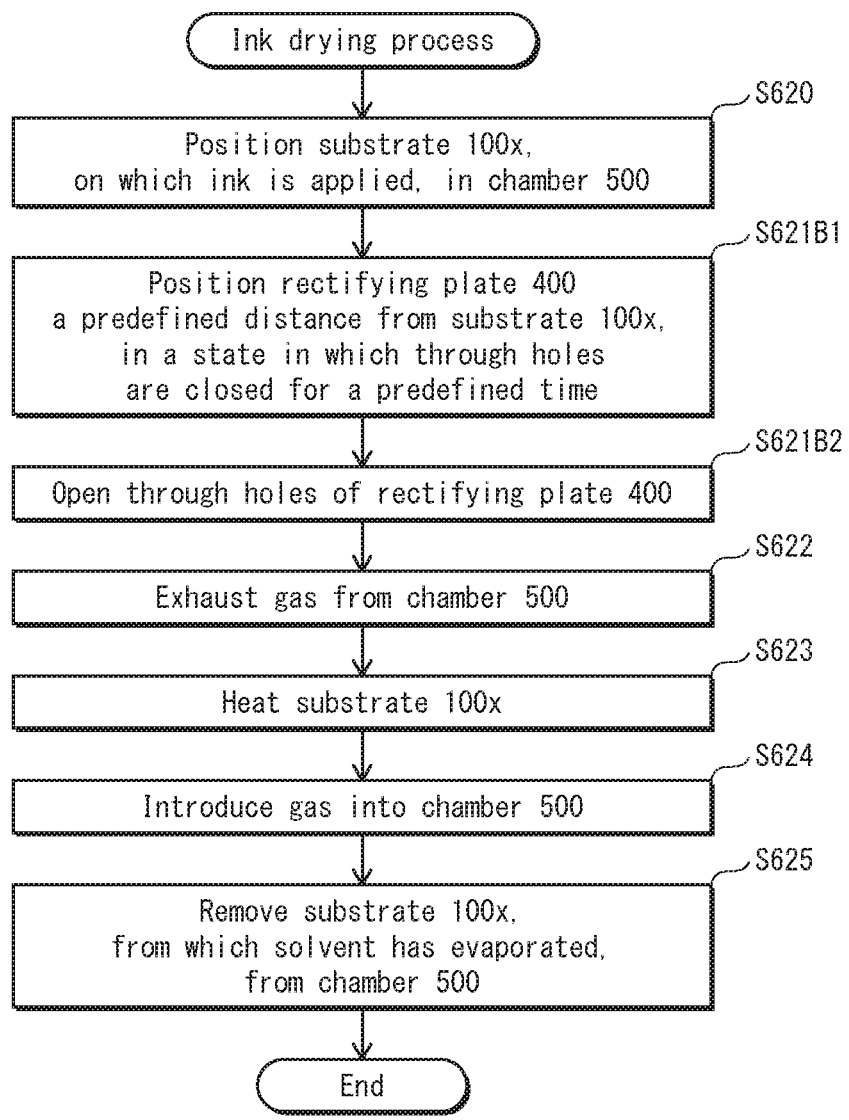
FIG. 29 is a flowchart of a process of ink drying in a method of manufacturing organic EL display panel 10 according to at least one embodiment.

The following describes an ink drying method (step S62 in FIG. 7) using the ink drying device 900B. FIG. 29 is a flowchart of a process of ink drying using the ink drying device 900B in a method of manufacturing the organic EL display panel 10 according to at least one embodiment. In FIG. 29, processes other than step S621B1 and S621B2 are the same as those shown in the ink drying method of at least one embodiment shown in FIG. 10.

In step S620, the substrate 100x, onto which ink containing organic light emitting material is applied in the gaps 522z between the column banks 522Y, is placed on the support base 700, and moved into the chamber 500 so that the substrate 100x is inside the chamber 500.

In step S621B1, the rectifying plate 400 is moved downward from above in the chamber 500, to be held by the spacers 800 provided around the support base 700. As described above, in the ink drying device 900B, the through holes 400a of the rectifying plate 400 are provided with the covering mechanism 450, which is capable of opening and closing. In step S621B1, the lid portion 450b of the covering mechanism 450 is located above the through holes 400a of the rectifying plate 400 and covers all or part of the through holes 400a, with the substrate 100x and the rectifying plate 400 facing each other, for a predefined period of time. In at least one embodiment, the time for which the substrate 100x and the rectifying plate 400 are held facing each other in a state in which all or part of the through holes 400a are covered varies depending on exhaust profile (exhaust speed) but is, for example, from 30 seconds to 180 seconds from the start of exhaust.

As a result, ink drying can be suppressed by regulating the gap between the support base 700 and the rectifying plate 400 to a predefined distance, and regulating the gap between the rectifying plate 400 and the column banks 522Y on the substrate 100x to be in a predefined distance range while the through holes 400a are closed for a predefined time. That is, a high vapor concentration of ink solvent vapor Air1 is maintained in the environment between the rectifying plate 400 and the column banks 522Y of the substrate 100x, forming a region of solvent vapor saturation above the substrate 100x and suppressing ink solvent evaporation from the partitioned region 10a of the substrate 100x. Thus, immediately after ink is ejected, in the gaps 522z constituting the column shaped application region, film thickness variation occurs due to variation in ink ejection amounts of ink ejection ports, but while all or part of the through holes 400a are closed for a predefined time, movement of ink in the gaps 522z of the substrate 100x is permitted, and therefore ink in the gaps 522z moves in the column direction, levelling film thickness variation in the predefined time. As a result, variation in film thickness along the column direction of ink application caused by factors such as variation in ink ejection amount and non-ejection of ejection ports is reduced.

Subsequently, the covering mechanism 450 is operated to move the lid portion 450b of the covering mechanism 450 to a position not overlapping the through holes 400a to uncover the through holes 400a, so the open portions 450a are positioned over the through holes 400a of the rectifying plate 400 to open the through holes 400a (step S621B1).

In this state, the vacuum pump 600 is driven to reduce pressure in the chamber 500 from atmospheric pressure to vacuum (step S622). In step S622, change in pressure in the chamber 500 over time in the ink drying process is the same as in FIG. 11. In the pressure reduction process, in a time Tini from 2 min to 3 min from the start, air flow F11 is generated from inside the chamber 500 where the support base 700 and the rectifying plate 400 are located to outside the chamber 500, in FIG. 28B. Solvent vapor evaporated from ink applied to the substrate 100x and sucked by the air flow F11 primarily moves from the gap between the substrate 100x and the rectifying plate 400 to above the rectifying plate 400 via the through holes 400a, to be exhausted outside the chamber 500 by the air flow F11 in the time Tini.

Next, pressure inside the chamber 500 is reduced until the pressure becomes equal to or less than a predefined reference value, solvent contained in the applied ink is evaporated to dry the ink, and the substrate 100x is baked to form the light emitting layers 123 (step S623).

When the baking process is completed, gas is introduced into the chamber 500 (step S624), the rectifying plate 400 is retracted from the substrate 100x, the support base 700 is moved out of the chamber 500, conveying the substrate 100x on which the light emitting layers 123 are formed out of the chamber 500 (step S625), ending the ink drying process.

As described above, according to the ink drying device 900B pertaining to at least one embodiment and the ink drying method using same, the covering mechanism 450 capable of opening and closing all or part of the through holes 400a of the rectifying plate 400 is provided, and in a state in which the lid portion 450b of the covering mechanism 450 is positioned above the through holes 400a of the rectifying plate 400, covering all or part of the through holes 400a, substrate 100x and the rectifying plate 400 are arranged facing each other for a predefined time, the gap between them being regulated to a predefined range.

As a result, ink in the gaps 522z moves in the column direction, levelling variation in film thickness for a predefined time, reducing variation in film thickness along the column direction of ink application caused by factors such as variation in ink ejection amount and non-ejection of ejection ports.

Further, after the predefined time elapses, the gap between the rectifying plate 400 and the column banks 522Y on the substrate 100x is regulated to a predefined rage, and the ratio of the gap between the rectifying plate 400 and the column banks 522Y to diameter of the through holes 400a is regulated to a predefined range. Further, diameter and pitch of the through holes 400a realizes a uniform arrangement at least in a region opposing the partitioned region 10a of the substrate 100x.

Thus, in the space between the substrate 100x and the rectifying plate 400, ink solvent vapor evaporated from the partitioned region 10a of the substrate 100x is suppressed from moving across the substrate 100x and the ink solvent vapor evaporated from the partitioned region 10a is exhausted above the rectifying plate 400 via the through holes 400a at a uniform speed in the partitioned region.

As a result, suppressing film thickness variation caused by imbalance of solvent evaporation rate due to vapor concentration distribution of ink solvent in the central portion and the peripheral portion in the row and column directions of the substrate, and caused by imbalance of ink surface tension in the central portion and the peripheral portion in the column direction is possible. Further, further reduction luminance unevenness caused by nonuniformity of film thickness of light emitting layers 123 in the central portion and the peripheral portion of the film forming area is possible.

Note that the ink drying device 900B may be configured to have a peripheral wall surrounding a region facing the column banks 522Y, as in the ink drying device 900A.

10. Summary

As described above, according to the manufacturing method pertaining to at least one embodiment described above, in a display panel manufactured by applying ink containing organic light emitting material onto a substrate in column shaped application regions, by making the film thickness of the light emitting layers 123 in the column shaped application regions and between the column shaped application regions more uniform, reducing luminance unevenness caused by nonuniformity of film thickness of the light emitting layers 123 in the central portion and peripheral portion of a film forming area is possible.

The display panel 10 pertaining to at least one embodiment has been described, but the present invention is not limited to the embodiment above. For example, various modifications of embodiments conceived by a person having ordinary skill in the art, and any combination of elements and functions of embodiments and modifications that does not depart from the spirit of the present invention are also included in the present invention. The following describes such embodiments of the display panel 10.

(1) Regarding at least one embodiment, no description was provided specifying the number of sheets of the display panel 10 formed simultaneously from one substrate in mass production of the display panel 10. However, in mass production of the display panel 10, when multiples of the display panel 10 are formed from one substrate, each partitioned region 10a of each display panel 10 is of course one film forming area. This is because, even in the case of multiples of the display panel 10 being formed from one substrate, when adjacent film forming areas (partitioned regions 10a) are separated from each other by at least a predefined distance, solvent vapor pressure in a peripheral portion of each film forming area is less than in a central portion thereof.

(2) According to at least one embodiment above, in FIG. 1 for example, the display panel 10 represents an example in which the substrate 100x has the partitioned region 10a in which the column banks 522Y and the row banks 122X are arranged defining light emitting units of each color R, G, and B, partitioned in a matrix, and the non-partitioned region 10b (10Xb and 10Yb in the X and Y directions, respectively, and 10b where no distinction is required). However, a peripheral partitioned region partitioned by a lattice-like insulating layer may be provided around all or part of the partitioned region 10a in which the column banks 522Y and the row banks 122X are arranged. Ink for forming red light emitting layers, green light emitting layers, and blue light emitting layers is applied in the peripheral partitioned region in the portioned partitioned by lattice-like insulating layers, as in the partitioned region 10a. Further, the non-partitioned region 10b may be provided around the peripheral partitioned region.

(3) According to at least one embodiment above, in FIG. 1, in the display panel 10, the non-light emitting region 10ne is formed without the organic EL display elements 100 in a predefined number of sections from the outer edge of the partitioned region 10a on the substrate 100x. However, the pixel electrode layers 119 may be provided in each section on the substrate 100x as the display element region 10e, as far as the ends 522Ye of the column banks 522Y. Therefore, effectively utilizing the film formation area on the substrate and enlarge the display element region 10e, contributing to cost reduction is possible.

(4) According to the display panel 10, above the sub pixels 100se in the gaps 522z, the upper substrate 130 made of a light transmissive material and the color filter layer 128 are provided. However, for the example of the display panel 10, the upper substrate made of a light transmissive material need not be provided, and the color filter layer 128 need not be provided above the gaps 522z. Thus, in addition to suppressing reflection of external light and improving light emission efficiency, manufacturing cost can be reduced.

(5) According to the display panel 10, the light emitting layers 123 are continuous in the column direction over the row banks. However, the light emitting layers 123 may be discontinuous and separated by the row banks into individual pixels. Even according to this configuration, luminance unevenness caused by distribution of ink solvent vapor concentration can be improved.

(6) According to the display panel 10, colors of light emitted by the light emitting layers 123 of sub pixels 100se in the gaps between the column banks 522Y that are adjacent in the row direction are different from each other, and color of light emitted by the light emitting layers 123 of sub pixels 100se in the gaps between the row banks 122X that are adjacent in the column direction is the same. However, the color of light emitted by the light emitting layers 123 of sub pixels 100se that are adjacent in the row direction may be the same, and colors of light emitted by the light emitting layers 123 of sub pixels 100se that are adjacent in the column direction may be different. Alternatively, for both the column and row directions, colors of light emitted by the light emitting layers 123 of sub pixels 100se that are adjacent may be different. Even according to this configuration, luminance unevenness caused by distribution of ink solvent vapor concentration can be reduced.

According to the display panel 10 pertaining to at least one embodiment, there are three colors of the pixels 100e: red pixels, green pixels, and blue pixels, but the present invention is not limited to this example. For example, there may be only one color of light emitting layer, or there may be four colors of light emitting layer such as red, green, blue, and yellow.

Further, according to at least one embodiment described above, the pixels 100e are arranged in a matrix shape, but the present invention is not limited to this. For example, when the pixel regions are spaced at one pitch, the effects of the present invention are achieved even when the pixel regions are shifted by a half pitch in the column direction between adjacent gaps. In high definition display panels, visually distinguishing slight shifts in the column direction is difficult even if film thickness unevenness on a straight line (or staggered line) having a certain width is lined up, as the shifts in the column direction are visually recognized as a band shape. Accordingly, improving display quality of a display panel, suppressing luminance unevenness, by using a staggered line arrangement is possible.

Further, according to the display panel 10, the pixel electrode layers 119 are disposed in all of the gaps 522z, but the present invention is not limited to this configuration. For example, gaps 522z in which the pixel electrode layers 119 are not formed may exist, for the purpose of forming a bus bar, or the like.

Further, according to at least one embodiment above, the hole injection layers 120, the hole transport layers 121, the light emitting layers 123, and the electron transport layer 124 are present between the pixel electrode layers 119 and the counter electrode layer 125, but the present invention is not limited to this. For example, a configuration may be used in which only the light emitting layers 123 are present between the pixel electrode layers 119 and the counter electrode layer 125, without using the hole injection layers 120, the hole transport layers 121, and the electron transport layer 124. Further, for example, a configuration may be used in which hole injection layers, hole transport layers, an electron transport layer, an electron injection layer, or the like is present, and a configuration may be used in which some or all of these layers are present. Further, in at least one embodiment, at least one of these layers does not include organic compounds, and a configuration may be used in which an inorganic compound is used.

Further, according to at least one embodiment above, a wet process such printing, spin coating, inkjets, or the like is used as a method of forming the light emitting layers 123, but the present invention is not limited to these examples. For example, a dry process can be used such as vacuum deposition, electron beam deposition, sputtering, reactive sputtering, ion plating, vapor phase growth, or the like. Further, publicly-known materials may be appropriately used as materials of each component.

According to at least one embodiment above, a configuration is used in which pixel electrode layers 119, which are anodes in a lower portion of EL elements, are connected to TFT sources, but a configuration may be used in which a counter electrode layer is in the lower portion of an EL element and an anode is disposed in an upper portion. In such a case, a cathode disposed in a lower portion is connected to a drain of the TFT.

Further, according to at least one embodiment above, a top-emission type of EL display panel is given as an example, but the present invention is not limited to this. For example, a bottom-emission type of display panel or the like can be used. In such a case, each configuration can be changed appropriately.

At least one embodiment described includes examples of the present invention. Values, shapes, materials, components, component positions and connections, processes, process order, and the like illustrated by the at least one embodiment do not indicate limitations of the present invention. Further, among the elements of at least one embodiment, processes not described in the independent claims that recite top level concepts of the present invention are described as elements of a different form.

Further, the order of processes described above are examples for at least one embodiment of the present invention, and may be different from the order described above. Further, a part of the processes described above may be executed simultaneously (in parallel) with another process.

Further, in order to facilitate understanding of the present invention, scale of the elements in each of the drawings mentioned for the embodiment above may be different from actual scale. Further, the present invention is not limited by the description of the embodiment, and can be appropriately changed without departing from the scope of the present invention.

Further, at least part of the functions of at least one embodiment and various modifications thereof may be combined.

Further, the present invention includes various modifications of at least one embodiment that may be conceived of by a person having ordinary skill in the art.

In at least one embodiment, the method of manufacturing the organic EL display panel pertaining to the present invention, and the ink drying device using same, are widely useful in manufacture of television sets, personal computers, portable telephones, and the like, as well as in manufacture of electronic devices that includes a process of forming a functional layer by using an ink application process.

Although the technology pertaining to the present disclosure has been fully described by way of examples with reference to the accompanying drawings, various changes and modifications will be apparent to those skilled in the art. Therefore, unless such changes and modifications depart from the scope of the present disclosure, they should be construed as being included therein.

What is claimed is:
1. An ink drying device comprising:
a chamber for receiving a substrate having ink thereon;
a support base in the chamber for supporting the substrate;
a rectifying plate comprising a uniform density of through holes;
a support, within the chamber, for positioning the rectifying plate to face the support base such that the rectifying plate is at a predefined distance from column banks of the substrate, and each through hole of the through holes face a corresponding column bank of the column banks, wherein the support directly contacts the support base and the rectifying plate;
a unit for exhausting gas from the chamber; and
a unit for heating the substrate.
2. The ink drying device of claim 1, wherein
a ratio of a minimum gap between the rectifying plate and the column banks and an opening length of the through holes is from 0.5 to 2.
3. The ink drying device of claim 1, wherein
a ratio of open area of the rectifying plate to a total area of the rectifying plate to be over the substrate in a range from 20% to 60%.
4. The ink drying device of claim 1, wherein
the rectifying plate comprises a peripheral wall surrounding a region on the rectifying plate that faces the column banks, wherein the peripheral wall is configured to surround the column banks in a plan view.
5. The ink drying device of claim 1, wherein a ratio of open area of the rectifying plate to a total area of the rectifying plate to be over the substrate is in a range from 20% to 40%.
6. The ink drying device of claim 1, further comprising:
a lidding mechanism capable of opening and closing all or part of the through holes.
7. The ink drying device of claim 6, wherein the lidding mechanism is configured to partially close each of the through holes.
8. The ink drying device of claim 6, wherein the lidding mechanism is configured to completely close each of the through holes.
9. The ink drying device of claim 1, wherein a pitch between adjacent through holes ranges from 20 mm to 30 mm.
10. The ink drying device of claim 1, wherein the unit comprises a pump, wherein the support base is between the pump and the rectifying plate.
11. The ink drying device of claim 1, wherein the rectifying plate comprises a first portion configured to cover the substrate; and a second portion which is configured to be outside of the substrate in a plan view.
12. The ink drying device of claim 1, further comprising:
a lidding mechanism movable relative to the rectifying plate.

13. The ink drying device of claim 1, further comprising:
an ink solvent vapor between the support base and the rectifying plate.

14. An ink drying device comprising:
a chamber for receiving a substrate having ink thereon;
a support base in the chamber for supporting the substrate;
a rectifying plate comprising a uniform density of through holes;
a support, for positioning the rectifying plate to face the support base such that the rectifying plate is at a predefined distance from column banks of the substrate, wherein each through hole of the through holes face a corresponding column bank of the column banks, and the support is entirely within the chamber;
a unit for exhausting gas from the chamber;
a lidding mechanism moveable relative to the rectifying plate; and
a unit for heating the substrate,
wherein the support directly contacts the support base and the rectifying plate.

15. The ink drying device of claim 14, wherein a ratio of open area of the rectifying plate to a total area of the rectifying plate to be over the substrate is in a range from 20% to 40%.

16. The ink drying device of claim 14, wherein the lidding mechanism is capable of opening and closing all or part of the through holes.

17. The ink drying device of claim 14, wherein the rectifying plate comprises a sidewall portion extending toward the support base, and the sidewall portion is outside a perimeter of the support base in a plan view.

* * * * *